(12) United States Patent
Liang et al.

(10) Patent No.: US 8,243,167 B2
(45) Date of Patent: Aug. 14, 2012

(54) IMAGE SENSOR HAVING OUTPUT OF INTEGRAL IMAGE

(75) Inventors: Jing-Shan Liang, Taipei (TW); Chien-Hong Lin, Hsinchu County (TW); Tzu-Fang Lee, Hsinchu (TW); Kuo-Yu Chuang, Yilan County (TW)

(73) Assignee: Industrial Technology Research Institute, Hsinchu (TW)

( * ) Notice: Subject to any disclaimer, the term of this patent is extended or adjusted under 35 U.S.C. 154(b) by 527 days.

(21) Appl. No.: 12/494,224

(22) Filed: Jun. 29, 2009

(65) Prior Publication Data

US 2010/0238312 A1 Sep. 23, 2010

(30) Foreign Application Priority Data

Mar. 20, 2009 (TW) ................................ 98109196 A

(51) Int. Cl.
*H04N 5/235* (2006.01)
*H04N 5/228* (2006.01)
(52) U.S. Cl. .................................. 348/230.1; 348/208.6
(58) Field of Classification Search ............... 348/208.6, 348/217.1, 230.1; 382/162, 163, 255, 258, 382/264, 268
See application file for complete search history.

(56) References Cited

U.S. PATENT DOCUMENTS

| 6,052,205 | A | 4/2000 | Matsuura |
| 6,108,437 | A | 8/2000 | Lin |
| 6,420,194 | B1 | 7/2002 | Reitman |
| 6,617,565 | B2 | 9/2003 | Wu |
| 7,042,439 | B2 | 5/2006 | Luo |
| 7,050,607 | B2 | 5/2006 | Li et al. |
| 7,099,505 | B2 | 8/2006 | Li et al. |
| 7,315,324 | B2 * | 1/2008 | Cleveland et al. .......... 348/208.4 |
| 7,315,631 | B1 | 1/2008 | Corcoran et al. |
| 7,852,402 | B2 * | 12/2010 | McGarvey et al. ............ 348/362 |
| 2009/0297057 | A1 * | 12/2009 | Ho ................................ 382/264 |
| 2010/0180189 | A1 * | 7/2010 | Ito et al. ........................ 715/219 |

FOREIGN PATENT DOCUMENTS

JP 04-313949 * 1/1991

OTHER PUBLICATIONS

Article Titled "A Parallel Architecture for Hardware Face Detection" authored by T.Theocharides et al. in Proceedings of the 2006 Emerging VLSI Technologies and Architectures (ISVLSI'06), IEEE, 2006.
Article Titled "Hardware Implementation of Adaboost Algorithm and Verification" authored by Shi et al., in 22nd International Conference on Advanced Information Networking and Applications—Workshops, IEEE, 2008, pp. 343-346.

* cited by examiner

*Primary Examiner* — Lin Ye
*Assistant Examiner* — Euel Cowan
(74) *Attorney, Agent, or Firm* — Jianq Chyun IP Office

(57) ABSTRACT

An image sensor having an output of an integral image is provided. The image sensor includes a pixel circuit, a line accumulator, and a volume accumulator. The pixel circuit includes a plurality of pixels for capturing pixel values of the pixels. The line accumulator is used for accumulating the pixel values of the pixels from a first pixel to a target pixel in a target pixel line of the image so as to obtain an accumulated line pixel value. The volume accumulator is used for adding the accumulated line pixel value output by the line accumulator to an integral pixel value of the pixel corresponding to the target pixel in a previous pixel line of the target pixel line, and using an adding result as the integral pixel value of the target pixel, so as to output the integral pixel value of the target pixel to form an integral image.

51 Claims, 16 Drawing Sheets

Two blocks (a)

Three blocks (b)

Four blocks (c)

IMAGE SENSOR HAVING OUTPUT OF INTEGRAL IMAGE

CROSS-REFERENCE TO RELATED APPLICATION

This application claims the priority benefit of Taiwan application serial no. 98109196, filed Mar. 20, 2009. The entirety of the above-mentioned patent application is hereby incorporated by reference herein and made a part of specification.

BACKGROUND

1. Field

The disclosure relates to an image sensor having an output of an integral image.

2. Description of Related Art

More and more image recognition techniques (for example, a face detection function of a digital camera) are now applied to small-scale embedded systems. Besides an image sensor, the embedded system also includes a high-speed embedded processor, which is used for processing images captured by the image sensor to recognize image features. Recently, Haar-like features are widely used in the image recognition domain, and especially used for the face detection. By using the Haar-like features and an adaptive boost (ADABOOST) algorithm, an image can be roughly and quickly classified into two groups, and by repeatedly executing such classifying procedure, the image can be quickly classified into a plurality of image clusters, so as to achieve the image recognition function.

The ADABOOST algorithm is a commonly used classifier fusion method, which can combine a plurality of weak classifier into a strong classifier. In detail, according to the ADABOOST algorithm, each data in a raw image set is weighted, and the weights are updated according to a classification result of an established sub classifier thereof, and then data required for establishing a next sub classifier is generated according to the weights. Since the new sub classifier is mainly used for reinforcing an inadequate part (classification error) of a previous classifier, the weight of the data of the previous classification error is increased. Conversely, the weight of the correctly classified data is reduced. Accordingly, the new sub classifier is re-established. Detail steps are as follows:

Assuming $D_t(i)$ represents a data significance distribution after a t-th iteration, wherein i represents an i-th data, and assuming the significance of each data is the same at the beginning, so that $$D_1(i)=1/m \quad (1)$$

Wherein, m represents a number of data samples.

Assuming h represents a sub classification function and x represents a data point, $h_t(x)$ is then a result that the sub classifier classifies the data point x. Moreover, assuming y represents a correct classification result (+/−1, dichotomy), wherein if the classification is correct h(x) y, y*h(x)=+1, a significance of the data point can be reduced; and if the classification is incorrect h(x)≠y, y*h(x)=−1, the significance of the data point should be increased. Moreover, assuming a represents a weight required for modifying the data significance distribution and Z represents a normalization factor, the weight α after iteration can be calculated according to an error rate $\varepsilon_t$, and then the data significance distribution D(i) is modified according to the weight a and a determination of whether the classification is correct:

$$\alpha_t = \frac{1}{2}\ln\frac{1-\varepsilon_t}{\varepsilon_t} \quad (2)$$

$$D_{t+1}(i) = \frac{D_t(i)e^{-\alpha_t y_i h_t(x_i)}}{Z_t} \quad (3)$$

Then, a new sub classification function $h_{t+1}$ is trained according to $D_{t+1}(i)$, and after T iterations, a final classification function is:

$$H(x) = \text{sign}\left(\sum_{t=1}^{T}\alpha_t h_t(x)\right) \quad (4)$$

Finally, a classification of the test data is determined according to a vote number (i.e. the classification result H(x)).

FIGS. 1(a)-(d) are schematic diagrams of the conventional Haar-like features. Referring to FIGS. 1(a)-(d), the Haar-like features can be regarded as a group formed by a plurality of blocks, for example, two blocks (FIG. 1(a)), three blocks (FIG. 1(b)), or four blocks (FIG. 1(c)), and a feature value thereof is a sum of pixel values of pixels covered by the blocks in the image, wherein the white block represents +1 and the black block represents −1. For example, in the three-block group, the feature value is a sum of the pixel values of the pixels covered by a middle white block in the image 100 minus a sum of the pixel values of the pixels covered by a left and a right black block in the image 100 (shown as FIG. 1(d)), and the feature value is generally calculated according to an integral image.

For example, FIG. 2(a) and FIG. 2(b) are schematic diagrams illustrating conventional methods of calculating the feature value. Referring to FIG. 2(a) first, an integral value of a pixel $P(x_2,y_2)$ in an image 200 is a sum of pixel values of pixels within a rectangular block spanned by the pixel $O(x_1, y_1)$ of the top-left corner to the pixel $P(x_2,y_2)$. Next, referring to FIG. 2(b), a feature value of a block ABCD is A−B−C+D, wherein A is a feature value of a rectangular block spanned by the pixel O to the pixel A, B is a feature value of a rectangular block spanned by the pixel O to the pixel B, C is a feature value of a rectangular block spanned by the pixel O to the pixel C, and D is a feature value of a rectangular block spanned by the pixel O to the pixel D.

As described above, a high-speed processor has to be applied to calculate the integral image when recognizing the image feature. Then, the integral image is used to calculate the feature value, and perform the image recognition and the face detection, etc. Such complicated operation process can greatly consume an operation performance of the processor, so that it can be a great burden for an embedded processor of the digital camera, which is required to simultaneously process multiple functions.

SUMMARY

Accordingly, the disclosure is directed to an image sensor having an output of an integral image.

The disclosure provides an image sensor having an output of an integral image. The image sensor includes a pixel circuit, a line accumulator, and a volume accumulator. The pixel circuit includes a plurality of pixels, and is used for capturing pixel values of the pixels in an image. The line accumulator is coupled to the pixel circuit for accumulating the pixel values of the pixels from a first pixel to a target pixel in a target pixel line of the image, so as to obtain an accumulated line pixel value. The volume accumulator is coupled to the line accumulator for adding the accumulated line pixel value output by the line accumulator to an integral pixel value of the pixel corresponding to the target pixel in a previous pixel line of the target pixel line, and using an adding result as the integral pixel value of the target pixel, so as to output the integral pixel value of the target pixel.

The disclosure provides an image sensor having an output of an integral image. The image sensor includes a pixel circuit, a line accumulator, and N volume accumulators. The pixel circuit includes a plurality of pixels, and is used for capturing pixel values of the pixels in an image. The pixel circuit is divided into M×N rectangular regions, wherein M and N are positive integers. The line accumulator is coupled to the pixel circuit for accumulating the pixel values of the pixels from a first pixel to a target pixel in a target pixel line of each of the rectangular regions of the image, so as to obtain an accumulated line pixel value. The N volume accumulators are coupled to the line accumulator for adding the accumulated line pixel value output by the line accumulator to an integral pixel value of the pixel corresponding to the target pixel in a previous pixel line of the target pixel line of each of the rectangular regions, and using an adding result as the integral pixel value of the target pixel, so as to output the integral pixel value of the target pixel.

The disclosure provides an image sensor having an output of an integral image. The image sensor includes a pixel circuit, a line accumulator, and a volume accumulator. The pixel circuit includes a plurality of pixels, and is used for capturing pixel values of the pixels in an image. The pixel circuit is divided into M×N rectangular regions, wherein M and N are positive integers. The line accumulator is coupled to the pixel circuit for accumulating the pixel values of the pixels from a first pixel to a target pixel in a target pixel line of each of the rectangular regions of the image, so as to obtain an accumulated line pixel value. The volume accumulators is coupled to the line accumulator for adding the accumulated line pixel value output by the line accumulator to an integral pixel value of the pixel corresponding to the target pixel in a previous pixel line of the target pixel line of each of the rectangular regions, and using an adding result as the integral pixel value of the target pixel, so as to output the integral pixel value of the target pixel.

The disclosure provides an image sensor having an output of an integral image. The image sensor includes a pixel circuit, a line accumulator, and a volume accumulator. The pixel circuit includes a plurality of pixels, and is used for capturing pixel values of the pixels in an image, wherein the pixel circuit is divided into a plurality of rectangular regions, and the divided rectangular regions are not limited to have the same size. The line accumulator is coupled to the pixel circuit for accumulating the pixel values of the pixels from a first pixel to a target pixel in a target pixel line of each of the rectangular regions of the image, so as to obtain an accumulated line pixel value. The volume accumulators is coupled to the line accumulator for adding the accumulated line pixel value output by the line accumulator to an integral pixel value of the pixel corresponding to the target pixel in a previous pixel line of the target pixel line of each of the rectangular regions, and using an adding result as the integral pixel value of the target pixel, so as to output the integral pixel value of the target pixel. Wherein, the line accumulator is reset when a vertical boundary of the rectangular region is crossed or when a next scan pixel line is being switched to, and the volume accumulator is reset when the horizontal boundary of the rectangular region is crossed.

Accordingly, by adding an integral circuit to the image sensor having an output of an integral image of the disclosure, the pixel values received by the image sensor can be accumulated by one pixel line after another, and the accumulated integral image is output to a post processor for utilization. Therefore, a burden for the post processor to operate the integral image is mitigated.

In order to make the aforementioned and other features and advantages of the disclosure comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 4(a) and FIG. 4(b) illustrate an example for calculating an integral image according to an embodiment of the disclosure.

FIG. 5(a) and FIG. 5(b) illustrate an example for calculating feature values according to an embodiment of the disclosure.

FIG. 14 is an example of image division according to an embodiment of the disclosure.

FIG. 15 is an example of calculating an integral image according to an embodiment of the disclosure.

DESCRIPTION OF EMBODIMENTS

An image sensor generally contains millions of pixels, and regarding a design of the image sensor, a field integrated read system that transmits image data by one pixel line after another is adopted. Wherein, color filters of the image sensor include color pixel circuits arranged in an interlaced manner, such as a RGB color space, etc. An output port of the image sensor provides a plurality of output formats (for example, a RGB format, a YCrCb format and a YUV format, etc.) to meet different requirements of a post device. In the disclosure, an integral circuit is added to the image sensor for calculating an integral image of an image captured by the image sensor, so as to provide a new output format of the integral image to the post processor as a reference for face detection.

In detail, the ADABOOST algorithm is generally implemented by software, and is hard to be implemented by hardware since such algorithm is complicated and requires a large circuit to process data. Therefore, a simple accumulation circuit is directly configured in the image sensor in the disclosure to calculate integral data, and the calculated data is output as the integral image. Based on such integral data, the post processor can perform a simple addition and subtraction calculation to obtain an accumulated pixel value of all of pixels in a target region, so as to perform the face detection and accelerate a feature comparison. To fully convey the spirit of the disclosure, regarding the calculation of the integral image of a single image or divided images, embodiments of the image sensor having an output of an integral image are provided.

Figure 1:
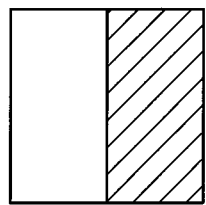
FIGS. 1(a)-(d) are schematic diagrams of the conventional Haar-like features.
Figure 1:
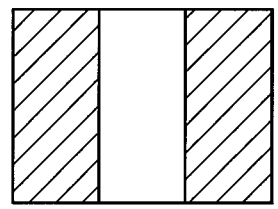
Figure 1:
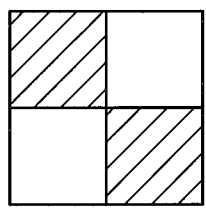
Figure 1:
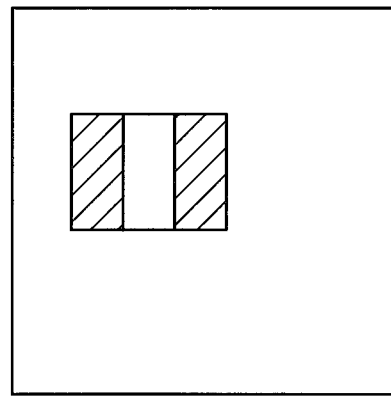
Figure 2:
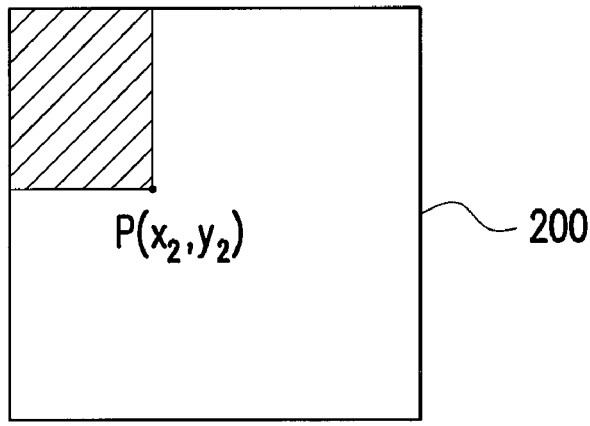
FIG. 2(a) and FIG. 2(b) are schematic diagrams illustrating conventional methods of calculating a feature value.
Figure 2:
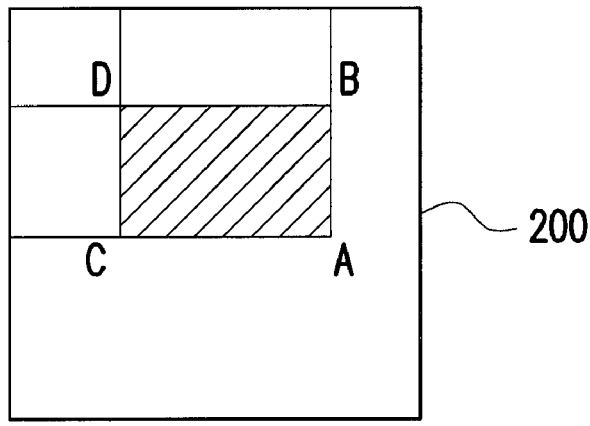
Figure 3:
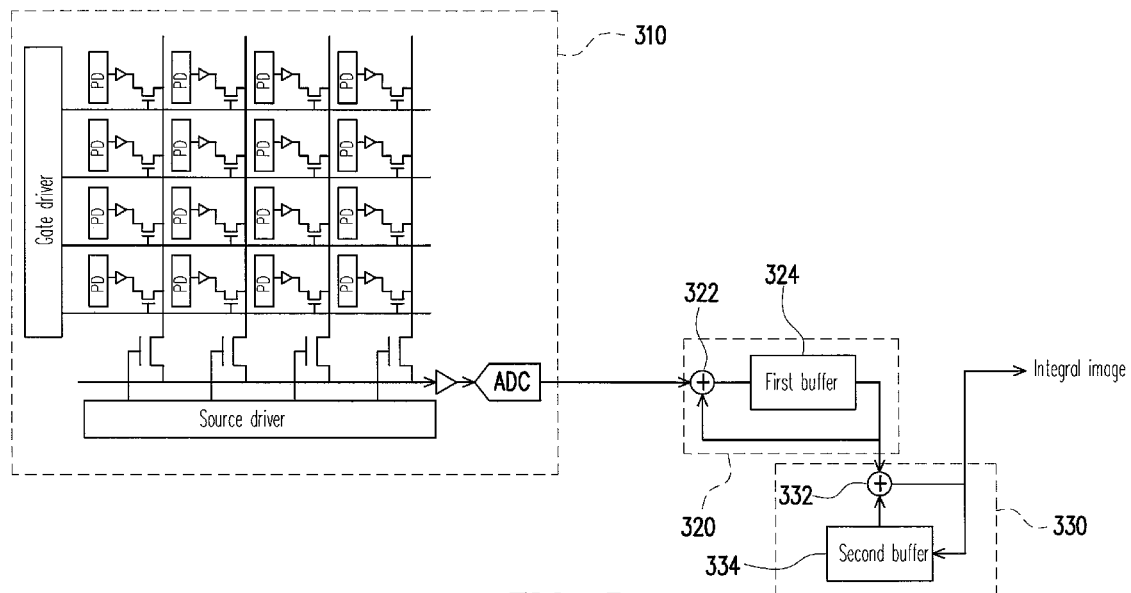
FIG. 3 is a block diagram illustrating an image sensor having an output of an integral image according to an embodiment of the disclosure.

FIG. 3 is a block diagram illustrating an image sensor having an output of an integral image according to an embodiment of the disclosure. Referring to FIG. 3, the image sensor includes a pixel circuit 310, a line accumulator 320 and a volume accumulator 330. Functions of the device are respectively described below.

The pixel circuit 310 includes a plurality of pixels and is used for capturing pixel values of the pixels in the image. The pixels in the pixel circuit 310 can be formed by charge coupled devices (CCD) or complementary metal-oxide semiconductor (CMOS) devices, which is not limited by the disclosure. Moreover, an image signal captured by the pixels can be converted into digital pixel values by an analog-to-digital converter (ADC), and output to a post device for utilization. It should be noticed that besides the plurality of pixels, the pixel circuit 310 also includes scan lines, data lines, gate drivers and source drivers, etc., which are commonly used devices in a conventional pixel circuit, and therefore detailed descriptions thereof are omitted herein.

The line accumulator 320 is coupled to the pixel circuit 310 for receiving the pixel values of the pixels in the image from the pixel circuit 310, and accumulating the pixel values of the pixels from a first pixel to a target pixel in a target pixel line of the image, so as to obtain an accumulated line pixel value. In detail, the line accumulator 320 includes a first adder 322 and a first buffer 324. The first adder 322 can accumulate the pixel value of the received target pixel to the accumulated line pixel value recorded by the first buffer 324, and the first buffer 324 is used for recording the accumulated line pixel value accumulated from the first pixel to the target pixel in the target pixel line, and outputting the accumulated line pixel value. Wherein, the first buffer 324 is reset each time after the first adder 322 accumulates the pixel values of all of the pixels in one pixel line, and then the first adder 322 continually accumulates the pixel values in a next pixel line. By such means, the pixel lines are accumulated one after another, so as to achieve a line integral effect.

The volume accumulator 330 is coupled to the line accumulator 320 for adding the accumulated line pixel value output by the line accumulator 320 to an integral pixel value of the pixel corresponding to the target pixel in a previous pixel line of the target pixel line, and using an adding result as the integral pixel value of the target pixel, wherein the integral pixel value of the pixels of the image output by the volume accumulator 330 can form the integral image of the image. In detail, the volume accumulator 330 includes a second adder 332 and a second buffer 334. Wherein, the second buffer 334 records the integral pixel value of the pixels in the previous pixel line of the target pixel line, and the second buffer 334 is only required to have a capacity enough for storing the integral pixel value of one pixel line. If the target pixel line is a first pixel line of the image, the integral pixel value recorded by the second buffer 334 is then accumulated from zero. The second adder 332 adds the accumulated line pixel value output by the line accumulator 320 that is accumulated to the target pixel in the target pixel line to the integral pixel value of the pixel corresponding to the target pixel in a previous pixel line, which is recorded by the second buffer 334, so as to obtain the integral pixel value of the target pixel.

It should be noticed that the pixel corresponding to the target pixel in the previous pixel line is in a same column with that of the target pixel. Namely, this pixel is located right above the target pixel. After the second adder 332 calculates the integral pixel value of the target pixel, the integral pixel value of the target pixel is output, and meanwhile the integral pixel value of the pixel corresponding to the target pixel in the previous pixel line that is recorded in the second buffer 334 is replaced by the integral pixel value of the target pixel to facilitate calculating the integral pixel value in a next scan line.

Moreover, in the present embodiment, the integral pixel value of the target pixel is calculated and directly output by the second adder 332 of the volume accumulator 330. In another embodiment, the integral pixel value of the target pixel is first stored in the second buffer 334, and is sequentially output by the second buffer 334, or after the second buffer 334 records the integral pixel values of the pixels of a whole target scan line, the pixel integral values are output at one time, which is not limited by the disclosure.

Figures 4, 5:
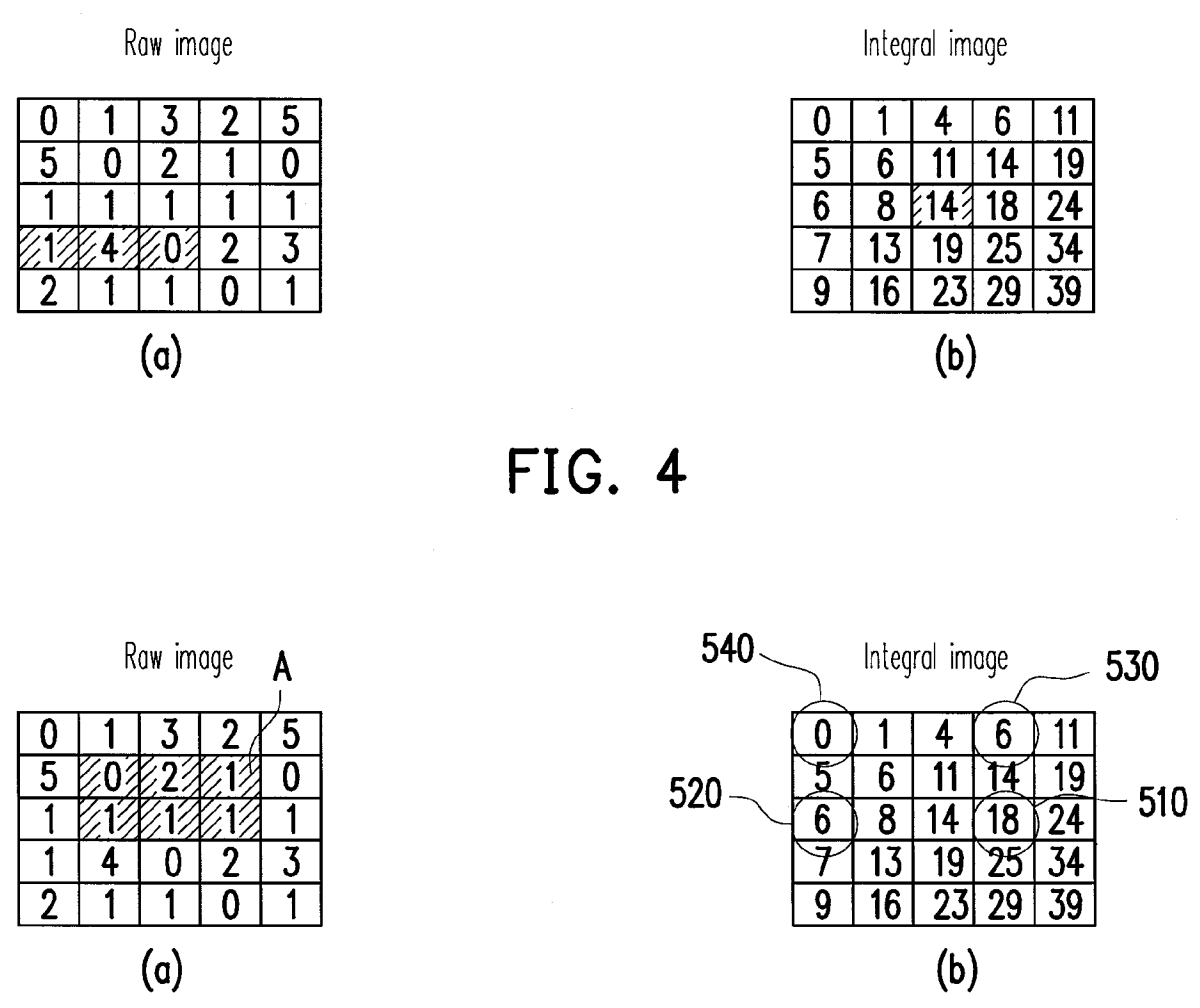

Regarding the aforesaid process that the image sensor calculates the integral image, another embodiment is provided for further description. FIG. 4(a) and FIG. 4(b) illustrate an example for calculating the integral image according to an embodiment of the disclosure. Referring to FIG. 4(a) and FIG. 4(b), assuming FIG. 4(a) illustrates a raw image captured by the image sensor, and FIG. 4(b) illustrates an integral image of the raw image of FIG. 4(a). When the image sensor calculates an integral pixel value of a third pixel in a fourth scan line, the line accumulator first accumulates the pixel values (i.e. 1, 4 and 0) of the pixels from a first pixel to the third pixel in the fourth pixel line of the raw image, so as to obtain an accumulated line pixel value 1+4+0=5. Then, the volume accumulator accumulates the accumulated line pixel value to an integral pixel value of a corresponding pixel (i.e. the third pixel) in a previous scan line (i.e. the third scan line), so as to obtain the integral pixel value (5+14=19) of the target pixel. Such integral pixel value can replace the integral pixel value of the corresponding pixel in the previous scan line that is recorded in the volume accumulator, and can be used for calculating the integral pixel value of a corresponding pixel (i.e. the third pixel) in a next scan line (i.e. a fifth scan line).

The above calculated integral image is output to the post processor, such that the post processor can obtain a desired feature value of the image feature by only performing a simple addition and subtraction calculation. FIG. 5(a) and FIG. 5(b) illustrate an example for calculating the feature values according to an embodiment of the disclosure. Referring to FIG. 5(a) and FIG. 5(b), assuming a feature value of a block A in the raw image is about to be obtained by the processor, the integral pixel values of edge pixels (i.e. a bottom-right pixel 510, a bottom-left pixel 520, a top-right pixel 530 and a top-left pixel 540) at four corners of the block A can be obtained according to the integral image, and then the addition and subtraction calculation is performed to obtain the feature value (0+18−6−6=6) of the block A. Such integral pixel value is a sum of the pixel values of all of the pixels in the block A of the raw image, i.e. 0+2+1+1+1+1=6.

According to a structure of the aforementioned image sensor, the integral pixel value can be calculated immediately when the image sensor captures the pixel values, so as to output a format of the integral image for the post processor to use. It should be noticed that to enhance a flexibility of the output image of the image sensor, in the disclosure, a pre-processing unit and a multiplexer are further configured to the image sensor, so as to provide a plurality of different formats of the output image. An embodiment is provided below for further description.

Figure 6:
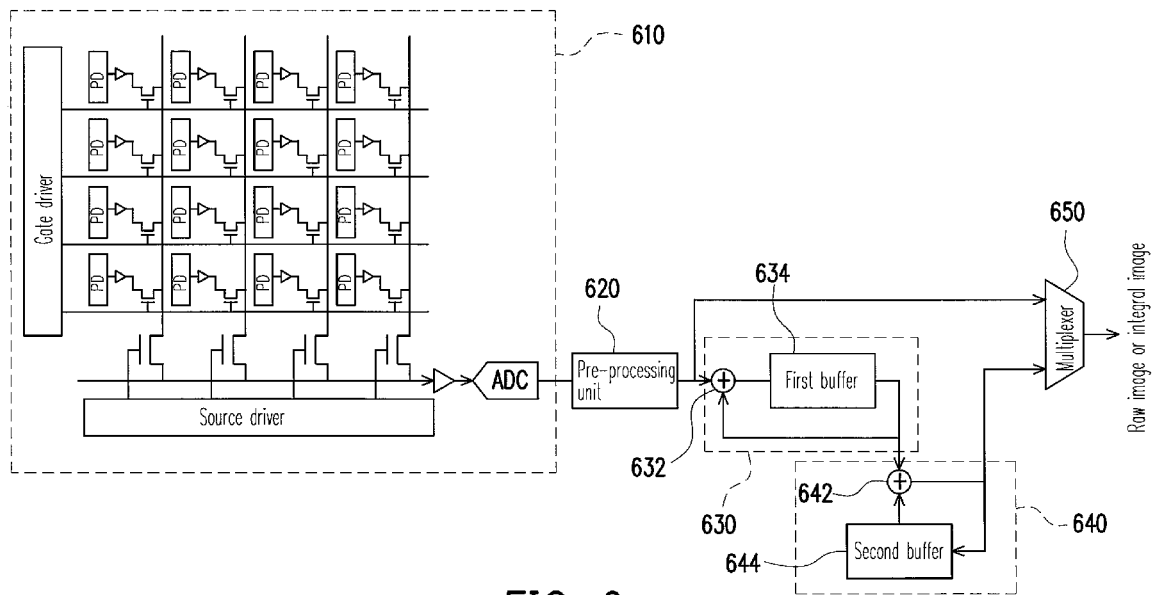
FIG. 6 is a block diagram illustrating an image sensor having an output of an integral image according to an embodiment of the disclosure.

FIG. 6 is a block diagram illustrating an image sensor having an output of an integral image according to an embodiment of the disclosure. Referring to FIG. 6, the image sensor includes a pixel circuit 610, a pre-processing unit 620, a line accumulator 630, a volume accumulator 640 and a multiplexer 650. Functions of the devices are respectively described as follows.

The pixel circuit 610 is used for capturing the pixel values of the pixels in the image. The pre-processing unit 620 performs a pre-processing such as color balance, de-mosaicking, distortion compensation or correction, etc. to the pixel values output by the pixel circuit 610.

The line accumulator 630 includes a first adder 632 and a first buffer 634. The line accumulator 630 is coupled to the pre-processing unit 620 for receiving pixel values of the pixels processed by the pre-processing unit 620 and accumulating the pixel values of the pixels from a first pixel to a target pixel in a target pixel line of the image, so as to obtain an accumulated line pixel value.

The volume accumulator 640 includes a second adder 642 and a second buffer 644. The volume accumulator 640 is coupled to the line accumulator 630 for accumulating the accumulated line pixel values output by the line accumulator 630 to an integral pixel value of the pixel corresponding to the target pixel in a previous pixel line of the target pixel line, and using an adding result as the integral pixel value of the target pixel.

The multiplexer 650 is coupled to the pre-processing unit 620 and the volume accumulator 640. The multiplexer 650 can directly output the pixel values of the pixels of the image or output the accumulated integral pixel values according to a format of the output image set by the user or the post processor.

According to the structure of the aforementioned image sensor, a plurality of formats of the output image are provided for the user or the post processor to select. If a general mode is selected, the captured raw image is output, and if a face detection mode is selected, the integral image of the captured image is output, so as to achieve a flexibility of selecting the output image.

In the above embodiment, the image sensor performs the integral operation on the captured image with a single color, though in another embodiment, the image sensor can also perform the integral operation on the data of different color spaces (for example, the RGB color space, the YCrCb color space and the YUV color space, etc.) in the image, so as to obtain the integral images of a plurality of color spaces. In detail, in the image sensor, a set of line accumulator and volume accumulator can be configured for a raw image of each of the color spaces that is captured by the pixel circuit, so as to calculate the integral image of the image on such color space, and output the integral image to the post processor for utilization. Wherein, a method that the line accumulator and the volume accumulator calculate the integral image is the same as or similar to that described in the aforementioned embodiment, and therefore detailed descriptions thereof are omitted herein.

Moreover, to reduce a calculation amount of the line accumulator and the volume accumulator in the image sensor to accelerate calculating the integral image, in the disclosure, the image is further divided into a plurality of rectangular regions, and the integral images of the rectangular regions are respectively calculated and are combined to form a new format of the integral image, and such new format of the integral image is output to the post processor for further utilization. After the integral image with the new format is received, the post processor can obtain the feature value of a specific block in the image by only performing a simple addition and subtraction operation. Another embodiment is provided below for further description.

Figure 7:
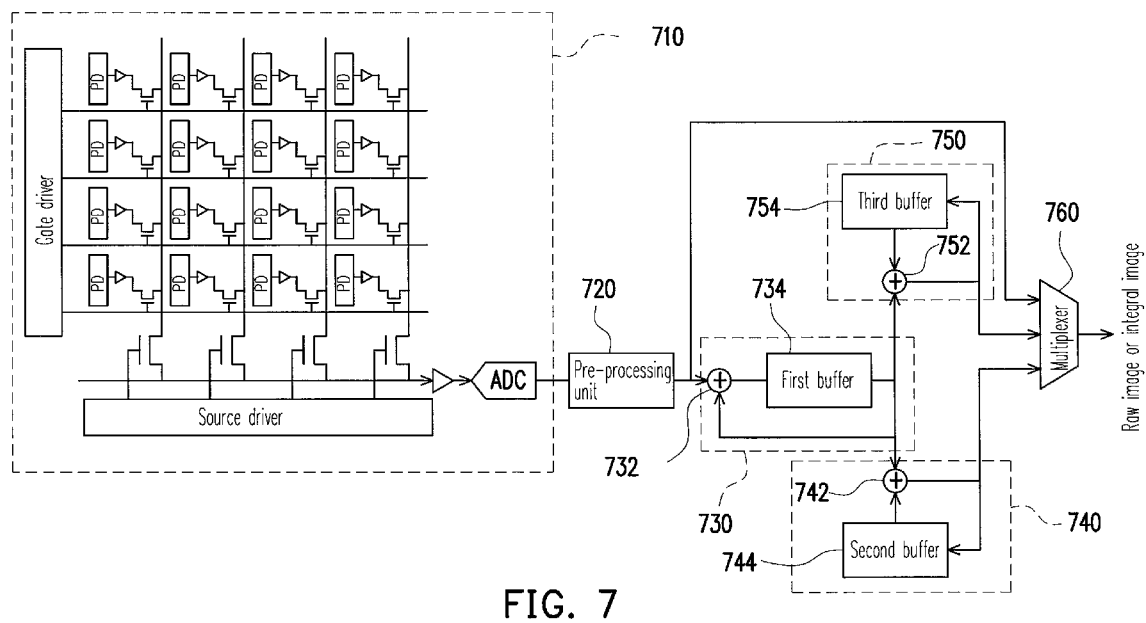
FIG. 7 is a block diagram illustrating an image sensor having an output of an integral image according to an embodiment of the disclosure.

FIG. 7 is a block diagram illustrating an image sensor having an output of an integral image according to an embodiment of the disclosure. Referring to FIG. 7, the image sensor includes a pixel circuit 710, a pre-processing unit 720, a line accumulator 730, a first volume accumulator 740, a second volume accumulator 750 and a multiplexer 760. Functions of the devices are described in detail below.

The pixel circuit 710 is used for capturing the pixel values of the pixels in the image. The pre-processing unit 720 performs the pre-processing such as color balance, de-mosaicking, distortion compensation or correction, etc. to the pixel values output by the pixel circuit 710. Wherein, the pixel circuit 710 is equally divided into a top-left region, a top-right region, a bottom-left region and a bottom-right region, and is used for capturing the pixel values of the pixels in each region. Similarly, in another embodiment, the pixel circuit 710 can also be equally divided into M×N rectangular regions, wherein M and N are positive integers, which is not limited by the disclosure.

The line accumulator 730 includes a first adder 732 and a first buffer 734. The line accumulator 730 is coupled to the pre-processing unit 720 for receiving pixel values of the pixels processed by the pre-processing unit 720, and accumulating the pixel values of the pixels from a first pixel to a target pixel in a target pixel line of each of the regions of the image, so as to obtain an accumulated line pixel value.

The first volume accumulator 740 includes a second adder 742 and a second buffer 744. The first volume accumulator 740 is coupled to the line accumulator 730 for accumulating the accumulated line pixel value of each of the region that is output by the line accumulator 730 to an integral pixel value of the pixel corresponding to the target pixel in a previous pixel line of the target pixel line of a same region, and using an adding result thereof as the integral pixel value of the target pixel of the region.

In detail, the line accumulator 730 can first accumulate the pixel values of the pixels from the first pixel to the target pixel in the target pixel line of the top-left region of the image, so as to obtain the accumulated line pixel value. Then, the first volume accumulator 740 accumulates the accumulated line pixel value to the integral pixel value of the pixel corresponding to the target pixel in a previous pixel line of the target pixel line of the top-left region, and uses a result thereof as the integral pixel value of the target pixel of the top-left region.

Moreover, the line accumulator 730 can accumulate the pixel values of the pixels from the first pixel to the target pixel in the target pixel line of the top-right region of the image, so as to obtain the accumulated line pixel value. Then, the first volume accumulator 740 accumulates the accumulated line pixel value to the integral pixel value of the pixel corresponding to the target pixel in a previous pixel line of the target pixel line of the top-right region, and uses the result thereof as the integral pixel value of the target pixel of the top-right region. By such means, the first volume accumulator 740 accomplishes the integral image operations of the top-left region and the top-right region of the image.

The second volume accumulator 750 includes a third adder 752 and a third buffer 754. The second volume accumulator 750 is coupled to the line accumulator 730 for accumulating the accumulated line pixel value of each of the regions output by the line accumulator 730 to an integral pixel value of the pixel corresponding to the target pixel in a previous pixel line of the target pixel line of the same region, and using an adding result as the integral pixel value of the target pixel of the region.

In detail, the line accumulator 730 can first accumulate the pixel values of the pixels from the first pixel to the target pixel in the target pixel line of the bottom-left region of the image, so as to obtain the accumulated line pixel value. Then, the second volume accumulator 750 accumulates the accumulated line pixel value to the integral pixel value of the pixel corresponding to the target pixel in a previous pixel line of the target pixel line of the bottom-left region, and uses the result thereof as the integral pixel value of the target pixel of the bottom-left region.

Moreover, the line accumulator 730 can accumulate the pixel values of the pixels from the first pixel to the target pixel in the target pixel line of the bottom-right region of the image, so as to obtain the accumulated line pixel value. Then, the second volume accumulator 750 accumulates the accumulated line pixel value to the integral pixel value of the pixel corresponding to the target pixel in a previous pixel line of the target pixel line of the bottom-right region, and uses the result thereof as the integral pixel value of the target pixel of the bottom-right region. By such means, the second volume accumulator 750 accomplishes the integral image operations of the bottom-left region and the bottom-right region of the image.

The multiplexer 760 is coupled to the pre-processing unit 720, the first volume accumulator 740 and the second volume accumulator 750. The multiplexer 760 can directly output the pixel values of the pixels of the image or output the accumulated integral pixel value of the top part or the bottom part of the image according to a format of the output image set by the user or the post processor.

Figure 8:
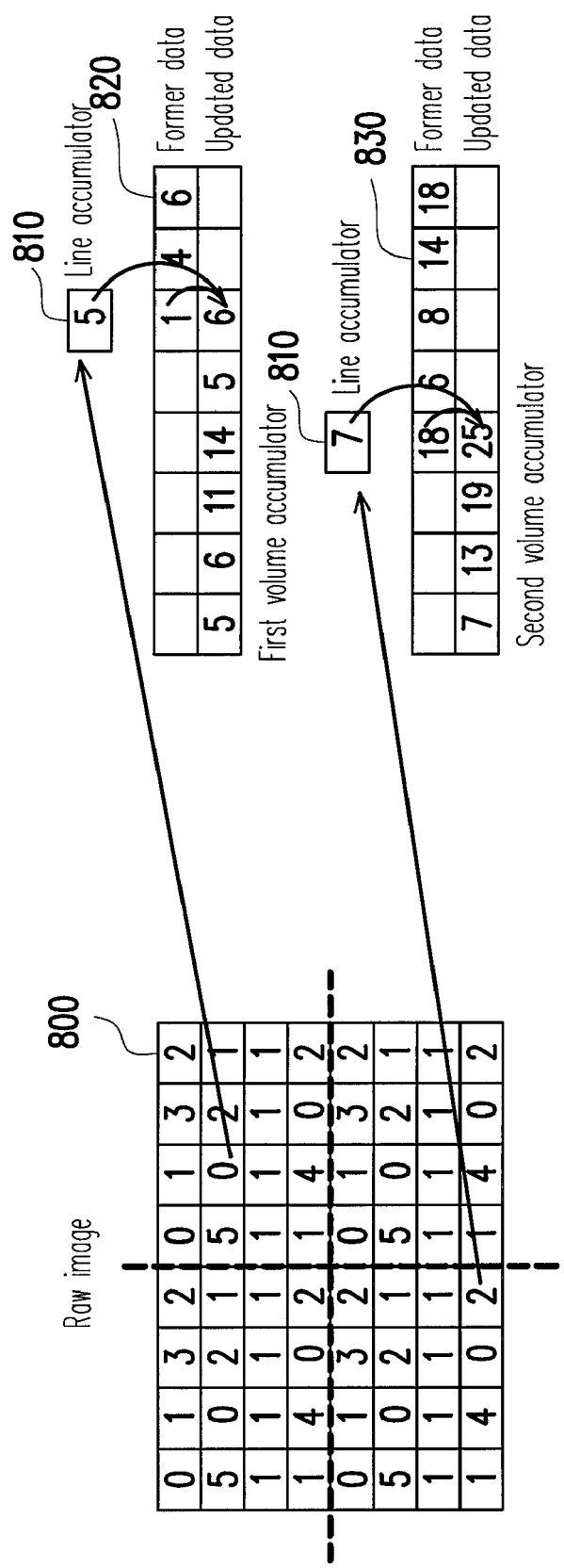
FIG. 8 is an example of calculating an integral image according to an embodiment of the disclosure.

Regarding the aforementioned process that the image sensor calculates the integral image, another embodiment is provided below for further description. FIG. 8 is an example of calculating the integral image according to an embodiment of the disclosure. Referring to FIG. 8, the image 800 at the left part of the diagram is a raw image captured by the image sensor, and the image 800 can be equally divided into 2×2 rectangular regions. Wherein, when the image sensor calculates the integral pixel value of the second pixel in the second scan line of the top-right region, the line accumulator 810 first accumulates the pixel values (i.e. 5 and 0) of the pixels from the fifth pixel to the sixth pixel in the second scan line of the raw image, so as to obtain the accumulated line pixel value 5+0=5.

Then, the first volume accumulator 820 accumulates the accumulated line pixel value to the integral pixel value of the corresponding pixel (i.e. the sixth pixel) in a previous scan line (i.e. the first scan line), so as to obtain the integral pixel value 5+1=6 of the target pixel. Such integral pixel value can replace the integral pixel value of the corresponding pixel in the previous scan line that is recorded in the first volume accumulator 820, and can be used for calculating the integral pixel value of a corresponding pixel (i.e. the sixth pixel) in a next scan line (i.e. the third scan line).

Similarly, when the image sensor calculates the integral pixel value of the fourth pixel in the fourth scan line of the bottom-left region, the line accumulator 810 first accumulates the pixel values (i.e. 1, 4, 0 and 2) of the pixels from the first pixel to the fourth pixel in the eighth scan line of the raw image, so as to obtain the accumulated line pixel value 1+4+0+2=7.

Then, the second volume accumulator 830 accumulates the accumulated line pixel value to the integral pixel value of the corresponding pixel (i.e. the fourth pixel) in a previous scan line (i.e. the seventh scan line), so as to obtain the integral pixel value 7+18=25 of the target pixel. Such integral pixel value can replace the integral pixel value of the corresponding pixel in the previous scan line that is recorded in the second volume accumulator 830.

It should be noticed that according to the structure of the aforementioned image sensor, two volume accumulators are applied to respectively accumulate the integral pixel values of the top part and the bottom part pixels in the image. However, in an embodiment, if a reset circuit is further added to the volume accumulator, and the accumulation is reset after the volume accumulator accumulates the integral pixel value of the top part pixels, the same volume accumulator can be used to continually accumulate the integral pixel values of the bottom part pixels, so as to save a hardware cost. Another embodiment is provided below for detail description.

Figure 9A:
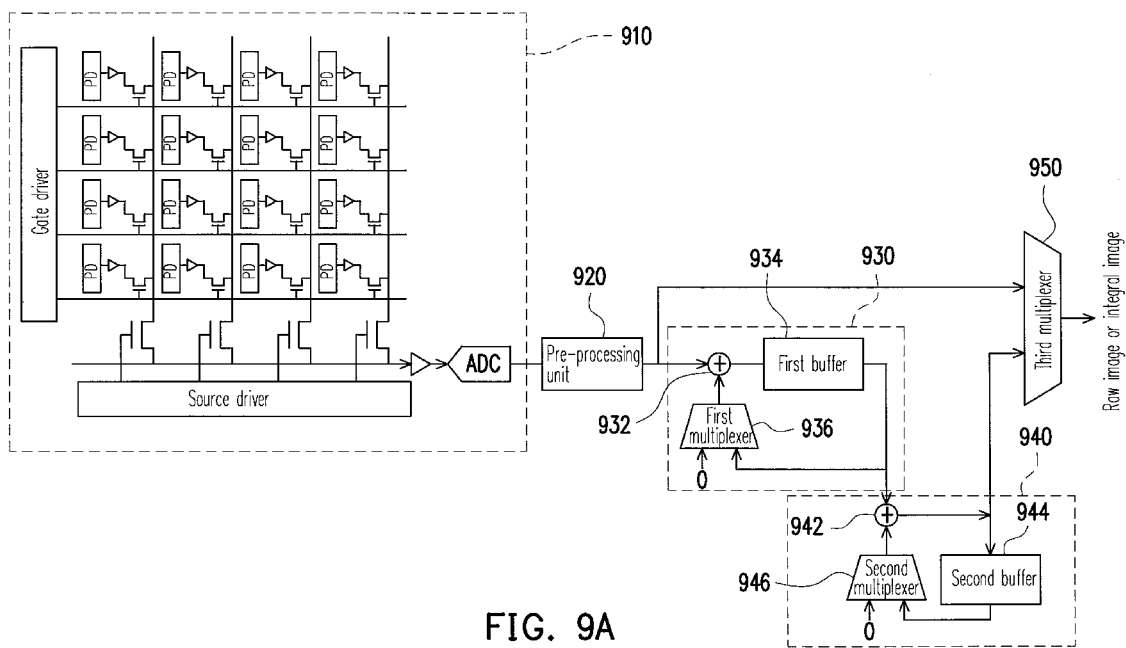
FIG. 9A is a block diagram illustrating an image sensor having an output of an integral image according to an embodiment of the disclosure.

FIG. 9A is a block diagram illustrating an image sensor having an output of an integral image according to an embodiment of the disclosure. Referring to FIG. 9A, the image sensor of the present embodiment includes a pixel circuit 910, a pre-processing unit 920, a line accumulator 930, a volume accumulator 940 and a third multiplexer 950. Functions of the devices are respectively described below.

The pixel circuit 910 is used for capturing the pixel values of the pixels in the image. The pre-processing unit 920 performs the pre-processing such as color balance, de-mosaicking, distortion compensation or correction, etc. to the pixel values output by the pixel circuit 910. Wherein, the pixel circuit 910 is equally divided into a top-left region, a top-right region, a bottom-left region and a bottom-right region, and is used for capturing the pixel values of the pixels in each region. Similarly, in another embodiment, the pixel circuit 910 can also be equally divided into M×N rectangular regions, wherein M and N are positive integers, which is not limited by the disclosure.

The line accumulator 930 includes a first adder 932, a first buffer 934 and a first multiplexer 936. The line accumulator 930 is coupled to the pre-processing unit 920 for receiving pixel values of the pixels processed by the pre-processing unit 920 and accumulating the pixel values of the pixels from a first pixel to a target pixel in a target pixel line of each region of the image, so as to obtain an accumulated line pixel value. It should be noticed that each time after the first adder 932 accumulates the pixel values of all of the pixels in a pixel line of each region of the image, a signal 0 is sent to the first multiplexer 936, and the first multiplexer 936 accordingly resets the first buffer 934, so that the first buffer 934 can be continually used to accumulate the pixel values of the pixels in a next pixel line.

The volume accumulator 940 includes a second adder 942, a second buffer 944 and a second multiplexer 946, and is used for accumulating the accumulated line pixel value of each of the regions output by the line accumulator 930 to an integral pixel value of the pixel corresponding to the target pixel in a previous pixel line of the target pixel line of the same region, and using an adding result as the integral pixel value of the target pixel of the region.

In detail, the line accumulator 930 can first accumulate the pixel values of the pixels from the first pixel to the target pixel in the target pixel line of the top-left region of the image, so as to obtain the accumulated line pixel value. Then, the first volume accumulator 940 accumulates the accumulated line pixel value to the integral pixel value of the pixel corresponding to the target pixel in a previous pixel line of the target pixel line of the top-left region, and uses a result thereof as the integral pixel value of the target pixel of the top-left region.

Moreover, the line accumulator 930 can reset and re-accumulate the pixel values of the pixels from the first pixel to the target pixel in the same target pixel line of the top-right region of the image, so as to obtain the accumulated line pixel value. Then, the volume accumulator 940 accumulates the accumulated line pixel value to the integral pixel value of the pixel corresponding to the target pixel in a previous pixel line of the target pixel line of the top-right region, and uses the result thereof as the integral pixel value of the target pixel of the top-right region. By such means, the first volume accumulator 940 accomplishes the integral image operations of the top-left region and the top-right region of the image.

It should be noticed that after the volume accumulator 940 accumulates the pixel values of the pixels of the top-left region and the top-right region, a signal 0 is sent to the second multiplexer 946, and the second multiplexer 946 accordingly resets the second buffer 944, so that the second buffer 944 can be continually used to accumulate the pixel values of the pixels of the bottom-left region and the bottom-right region.

After the volume accumulator 940 is reset, the line accumulator 930 can accumulate the pixel values of the pixels from the first pixel to the target pixel in the target pixel line of the bottom-left region of the image, so as to obtain the accumulated line pixel value. Then, the volume accumulator 940 accumulates the accumulated line pixel value to the integral pixel value of the pixel corresponding to the target pixel in a previous pixel line of the target pixel line of the bottom-left region, and uses the result thereof as the integral pixel value of the target pixel of the bottom-left region.

Moreover, the line accumulator 930 can reset and re-accumulate the pixel values of the pixels from the first pixel to the target pixel in the same target pixel line of the bottom-right region of the image, so as to obtain the accumulated line pixel value. Then, the volume accumulator 940 accumulates the accumulated line pixel value to the integral pixel value of the pixel corresponding to the target pixel in a previous pixel line of the target pixel line of the bottom-right region, and uses the result thereof as the integral pixel value of the target pixel of the bottom-right region. By such means, the volume accumulator 940 accomplishes the integral image operations of the bottom-left region and the bottom-right region of the image.

The third multiplexer 950 is coupled to the pre-processing unit 920 and the volume accumulator 940, and can directly output the pixel values of the pixels of the image or output the accumulated integral pixel value of the top part or the bottom part of the image according to a format of the output image set by the user or the post processor.

Figure 9B:
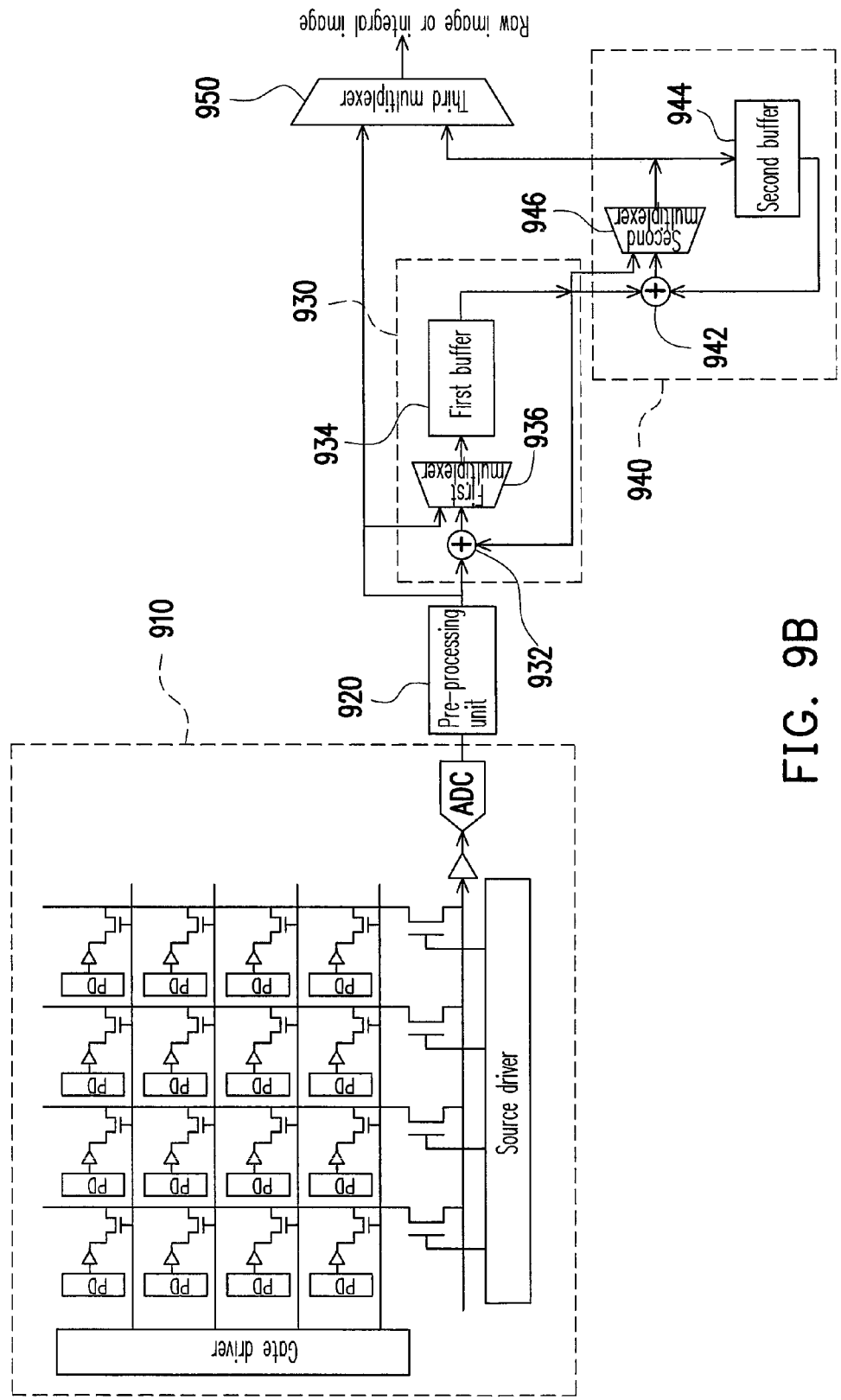
FIG. 9B is a block diagram illustrating an image sensor having an output of an integral image according to an embodiment of the disclosure.

FIG. 9B is a block diagram illustrating an image sensor having an output of an integral image according to an embodiment of the disclosure. Referring to FIG. 9B, the image sensor includes a pixel circuit 910, a pre-processing unit 920, a line accumulator 930, a first volume accumulator 940 and a third multiplexer 950. The difference between the image sensor of FIG. 9A and that of FIG. 9B is that, in the image sensor of the present embodiment, the first multiplexer 936 is disposed between the first adder 932 and the first buffer 934, and the second multiplexer 946 is disposed between the second adder 942 and the second buffer 944, so as to reset the first buffer 934 and the second buffer 944. Besides the aforesaid difference, functions of the devices in FIG. 9B are similar to those of the devices in FIG. 9A, and therefore detail descriptions thereof are not repeated.

Figure 10:
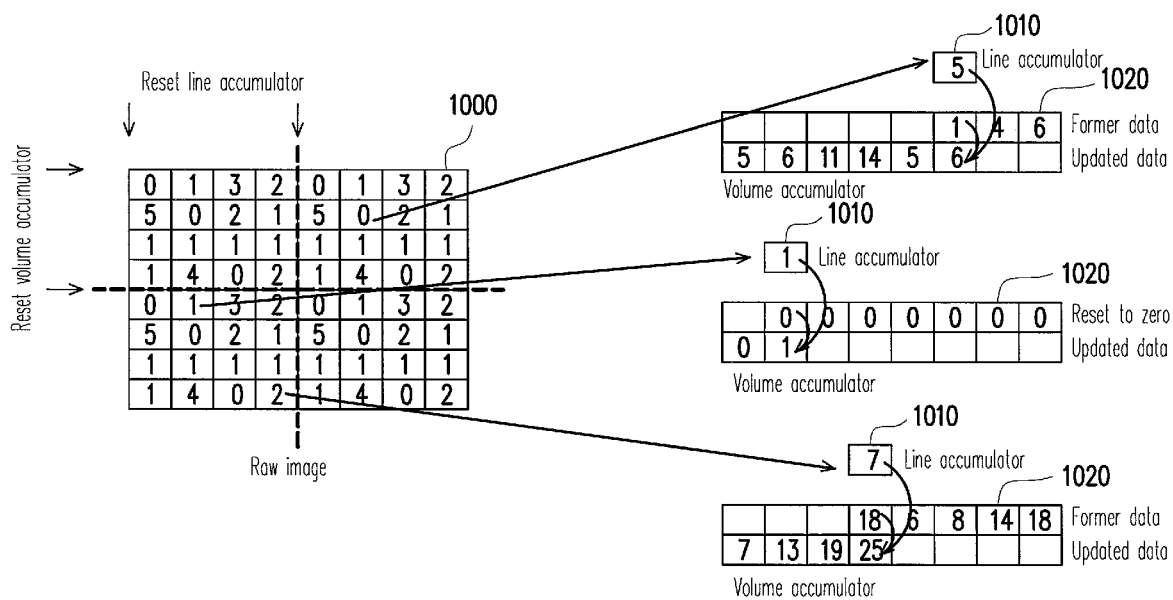
FIG. 10 is an example of calculating an integral image according to an embodiment of the disclosure.

Regarding the aforementioned process that the image sensor calculates the integral image, another embodiment is provided below for further description. FIG. 10 is an example of calculating the integral image according to an embodiment of the disclosure. Referring to FIG. 10, the image 1000 at the left part of the diagram is a raw image captured by the image sensor, and the image 1000 can be equally divided into 2×2 rectangular regions. Wherein, when the image sensor calculates the integral pixel value of the second pixel in the second scan line of the top-right region, the line accumulator 1010 first accumulates the pixel values (i.e. 5 and 0) of the pixels from the fifth pixel to the sixth pixel in the first scan line of the raw image, so as to obtain the accumulated line pixel value 5+0=5.

Then, the volume accumulator 1020 accumulates the accumulated line pixel value to the integral pixel value of the corresponding pixel (i.e. the sixth pixel) in a previous scan line (i.e. the first scan line), so as to obtain the integral pixel value 5+1=6 of the target pixel. Such integral pixel value can be used for replacing the integral pixel value of the corresponding pixel in the previous scan line that is recorded in the volume accumulator 1020, and can be used for calculating the integral pixel value of a corresponding pixel (i.e. the sixth pixel) in a next scan line (i.e. the third scan line).

It should be noticed that after the image sensor calculates the integral pixel value of the fourth pixel in the fourth scan line of the top-right region, the integral pixel value accumulated in the volume accumulator 1020 is then reset, so that the volume accumulator 1020 can be used for accumulating the integral pixel value of the pixels in the bottom-left region. When the image sensor calculates the integral pixel value of the second pixel in the first scan line of the bottom-left region, the line accumulator 1010 first accumulates the pixel values (i.e. 0 and 1) of the pixels from the first pixel to the second pixel in the fifth scan line of the raw image, so as to obtain the accumulated line pixel value 0+1=1. Thereafter, the volume accumulator 1020 accumulates the accumulated line pixel value to the integral pixel value (has been reset) of the corresponding pixel in a previous scan line, or directly loads a new value for re-accumulation, so as to obtain the integral pixel value 1 of the target pixel.

Similarly, when the image sensor calculates the integral pixel value of the fourth pixel in the fourth scan line of the bottom-left region, the line accumulator 1010 first accumulates the pixel values (i.e. 1, 4, 0 and 2) of the pixels from the first pixel to the fourth pixel in the eighth scan line of the raw image, so as to obtain the accumulated line pixel value 1+4+0+2=7.

Thereafter, the volume accumulator 1020 accumulates the accumulated line pixel value to the integral pixel value of the corresponding pixel (i.e. the fourth pixel) in a previous scan line (i.e. the seventh scan line), so as to obtain the integral pixel value 7+18=25 of the target pixel. Such integral pixel value can be used for replacing the integral pixel value of the corresponding pixel in the previous scan line that is recorded in the volume accumulator 1020.

Figure 11:
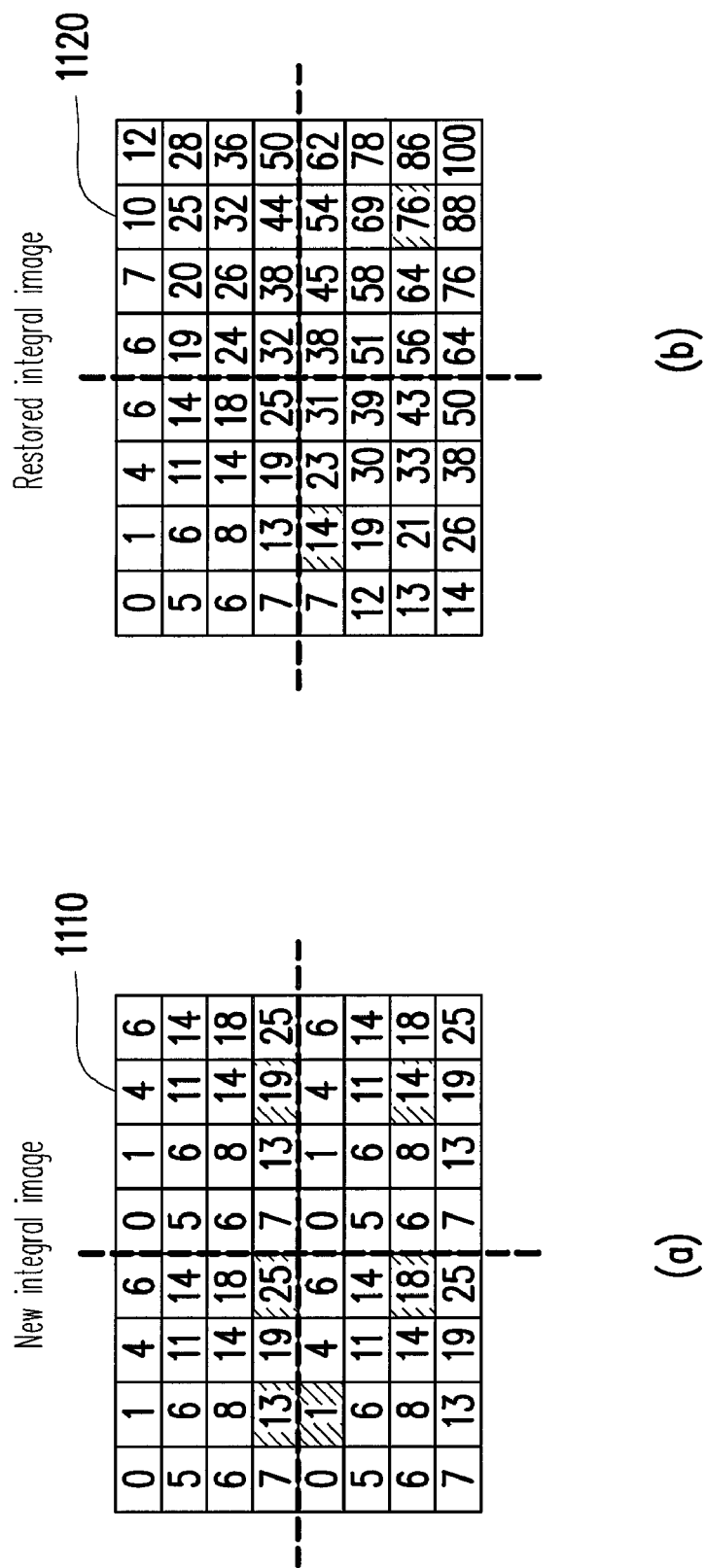
FIG. 11(a) and FIG. 11(b) illustrate an example of calculating an integral image according to an embodiment of the disclosure.

The aforementioned calculated sub-integral images are output to the post processor. Then, the post processor can restore the integral image by only performing a simple addition and subtraction, so as to obtain the feature value of the image feature. FIG. 11(*a*) and FIG. 11(*b*) illustrate an example of calculating the integral image according to an embodiment of the disclosure. Referring to FIG. 11(*a*) and FIG. 11(*b*), wherein FIG. 11(*a*) illustrates a sub integral image 1110 calculated by the aforementioned image sensor, and FIG. 11(*b*) illustrates a restored integral image 1120. Wherein, a top-left region of the integral image 1120 is the same to a top-left region of the sub integral image 1110, so that the processor can directly use the integral pixel values of the top-left region of the sub integral image 1110. However, when the processor calculates the integral pixel value of the second pixel in the first scan line of the bottom-left region of the integral image 1120, besides the integral pixel value of the corresponding pixel (i.e. the second pixel in the first scan line) of the bottom-left region is required to be referenced, the integral pixel value of the pixel (i.e. the second pixel in the fourth scan line) of the same column at the bottom line of the top-left region is also required to be counted By adding the two integral pixel values, the integral pixel value (i.e. 1+13=14) of the target pixel of the integral image 1120 is restored.

Similarly, when the processor calculates the integral pixel value of the third pixel in the third scan line of the bottom-right region of the integral image 1120, besides the integral pixel value of the corresponding pixel (i.e. the third pixel in the third scan line) of the bottom-right region is required to be referenced, the integral pixel value of the pixel (i.e. the fourth pixel in the fourth scan line) at the bottom-right corner of the top-left region, the integral pixel value of the pixel (i.e. the third pixel in the fourth scan line) of the same column at the bottom line of the top-right region, and the integral pixel value of the pixel (i.e. the fourth pixel in the third scan line) of the same row at the right edge of the bottom-left region are also required to be referenced. By adding the three integral pixel values, the integral pixel value (i.e. 14+25+19+18=76) of the target pixel of the integral image 1120 is restored.

Figure 12:
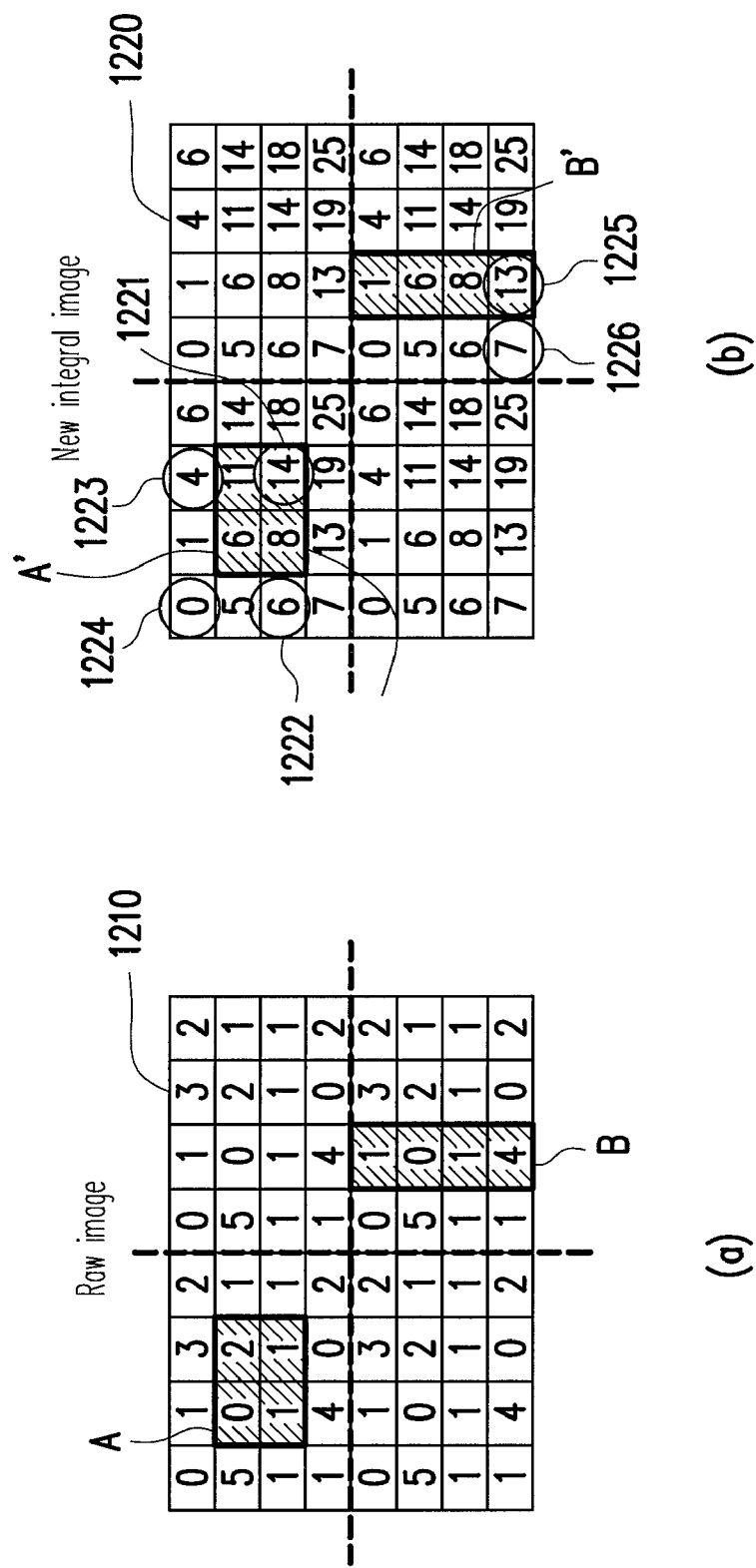
FIG. 12(a) and FIG. 12(b) illustrate an example of calculating the feature value according to an embodiment of the disclosure.

Moreover, the aforementioned new integral image can also be used to obtain a feature value of a specific region in the raw integral image. Regarding the feature value calculation of the specific region having only a single divided region, an example is provided below. FIG. 12(*a*) and FIG. 12(*b*) illustrate an example of calculating the feature value according to an embodiment of the disclosure. Wherein, FIG. 12(*a*) illustrates a raw image 1210, and FIG. 12(*b*) illustrates a sub integral image 1220 calculated by the aforementioned image sensor.

According to FIG. 12(*a*), the integral pixel value of the pixels contained in a block A of the raw image 1210 is 0+2+1+1=4. Next, referring to FIG. 12(*b*), if the integral pixel value of the pixels contained in the block A of the raw image 1210 is about to be obtained according to the sub integral image 1220, a corresponding block A' in the sub integral image 1220 is first found, and then the integral pixel value (14+0−4−6=4) of the pixels contained in the block A is calculated according to the integral pixel values of a bottom-right pixel 1221, a bottom-left pixel 1222, a top-right pixel 1223 and a top-left pixel 1224 of the block A'.

Similarly, according to FIG. 12(*a*), the integral pixel value of the pixels contained in a block B of the raw image 1210 is 1+0+1+4=6. Next, referring to FIG. 12(*b*), if the integral pixel value of the pixels contained in the block B of the raw image 1210 is about to be obtained according to the sub integral image 1220, a corresponding block B' in the sub integral image 1220 is first found, and then the integral pixel value (13+0−0−7=6) of the pixels contained in the block B is calculated according to the integral pixel values of a bottom-right pixel 1225 and a bottom-left pixel 1226 of the block B'. Wherein, since the top-right pixel and the top-left pixel are located out off the bottom-right region, the integral pixel values thereof are all set to 0.

Figure 13:
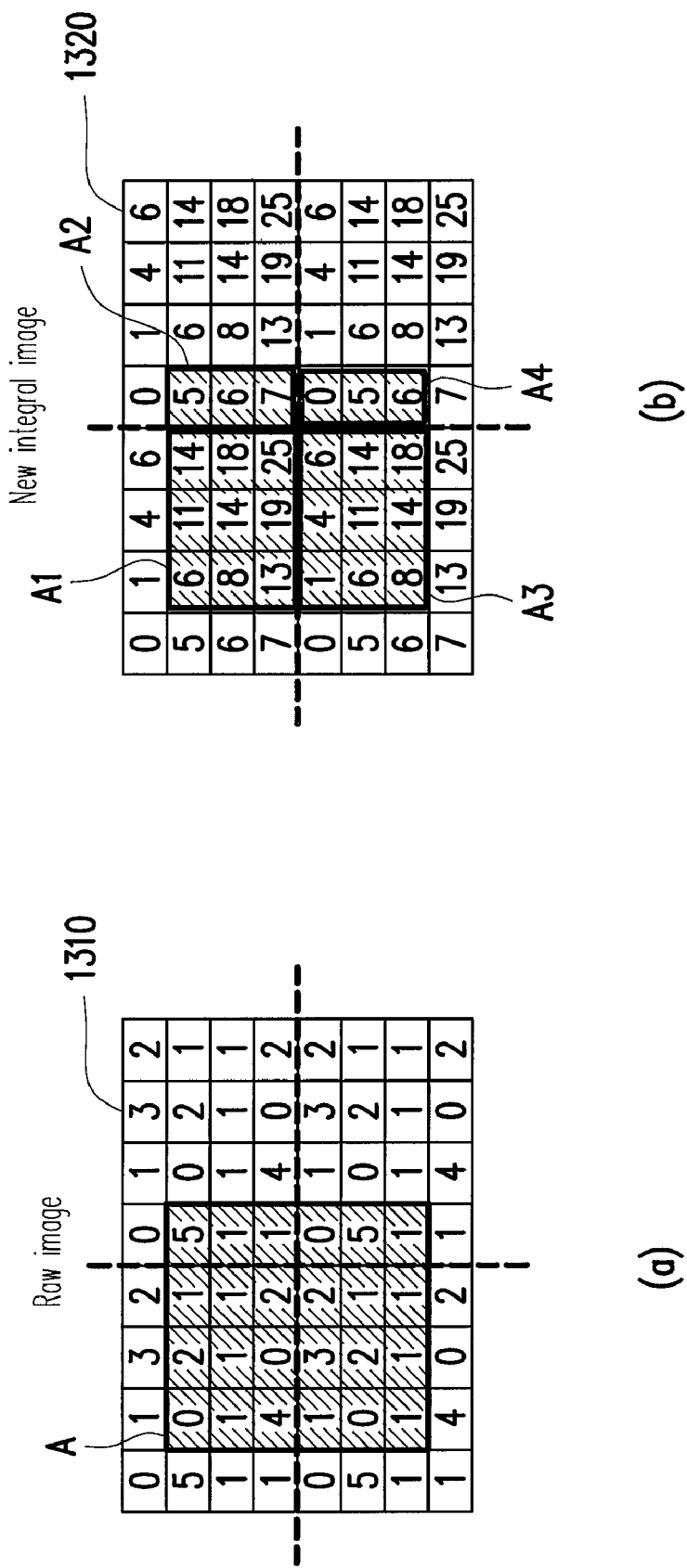
FIG. 13(a) and FIG. 13(b) illustrate an example of calculating the feature value according to an embodiment of the disclosure.

Regarding the feature value calculation of the specific region having a plurality of divided regions, an example is provided below. FIG. 13(*a*) and FIG. 13(*b*) illustrate an example of calculating the feature value according to an embodiment of the disclosure. Wherein, FIG. 13(*a*) illustrates a raw image 1310, and FIG. 13(*b*) illustrates a sub integral image 1320 calculated by the aforementioned image sensor.

According to FIG. 13(*a*), the integral pixel value of the pixels contained in the block A of the raw image 1310 is 12+7+12+6=37. Next, referring to FIG. 13(*b*), if the integral pixel value of the pixels contained in the block A of the raw image 1310 is about to be obtained according to the sub integral image 1320, since the block A contains 4 sub division regions, the block A is divided into four blocks A1, A2, A3 and A4, and the integral pixel values of the pixels contained in the four blocks are calculated according to the aforementioned method. Then, the integral pixel values of the blocks are added to obtain the integral pixel value of the pixels contained in the block A, which is (25+0−6−7)+(7+0−0−0)+(18+0−6−0)+(6+0−0−0)=12+7+12+6=37.

It should be noticed that according to the structure of the aforementioned image sensor, the image is divided into M×N rectangular regions. However, in another embodiment, the image can be divided into a plurality of rectangular sub regions, and each of the sub regions is bounded by two vertical boundaries and two horizontal boundaries. A division method thereof can be determined by the user, and is not limited to a chessboard-like division, and each of the sub regions is not limited to have an equal size, though each of the sub regions has to be a rectangle, so as to achieve flexibility for utilization.

Figures 14, 15:
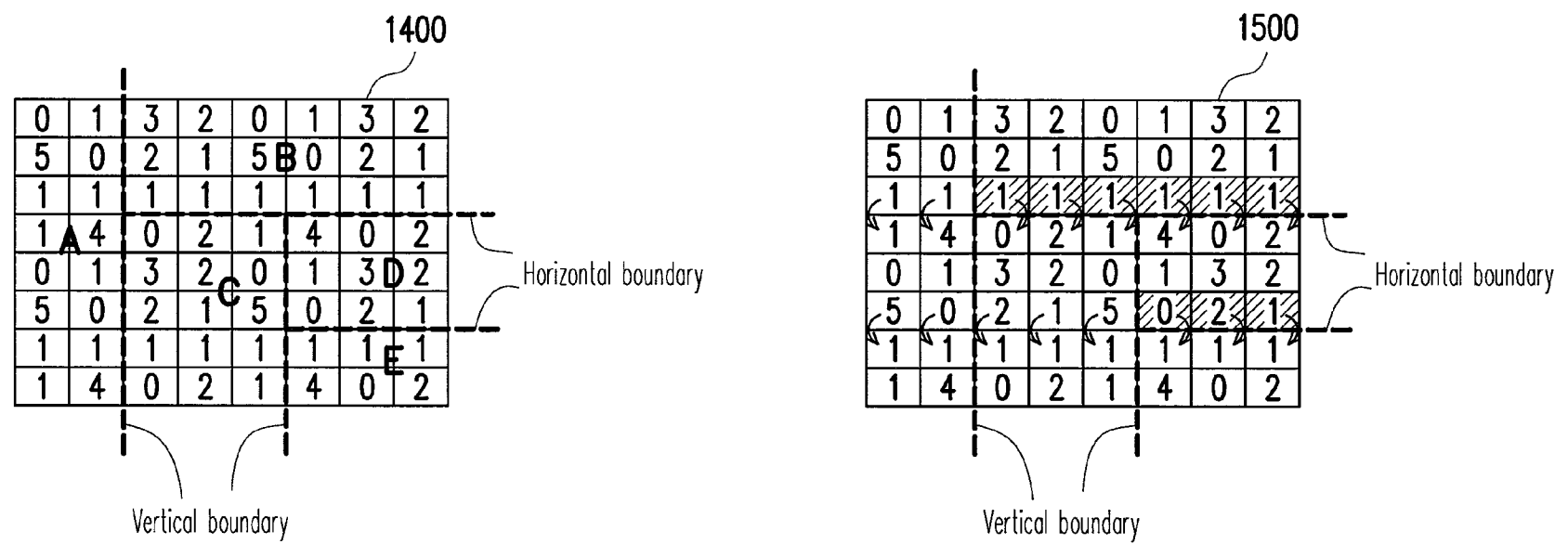

Regarding the aforesaid integral image division process of the image sensor, another embodiment is provided below for description. FIG. 14 is an example of image division according to an embodiment of the disclosure. Referring to FIG. 14, the image 1400 is a raw image captured by the image sensor, and is divided into five unequal sub regions including a left region A, a top-right region B, a middle region C, a middle-right region D and a bottom-right region E, wherein each of the sub regions is a rectangle, and is bounded by two vertical boundaries and two horizontal boundaries. Similarly, in another embodiment, the pixel circuit can also be divided into a plurality of rectangular sub regions, wherein a division method thereof is determined by the user, and is not limited to a chessboard-like division. Moreover, each of the sub regions is not limited to have an equal size, though each of the sub regions has to be a rectangle.

It should be noticed that when the image sensor calculates the integral pixel values, the calculation is performed by sequentially scanning the image, and is not influenced by the division. During the sequential scanning, each time when the vertical boundary is crossed, the line accumulator is reset to re-accumulate the accumulated line pixel value of the sub region in such pixel line. Moreover, during the sequential scanning, if the target pixel is found to cross the horizontal boundary compared to the corresponding pixel in the previous scan line, the volume accumulator is reset for re-accumulation, or a new value is directly loaded into the volume accumulator, so as to obtain the sub integral pixel value of the target pixel.

Figure 16:
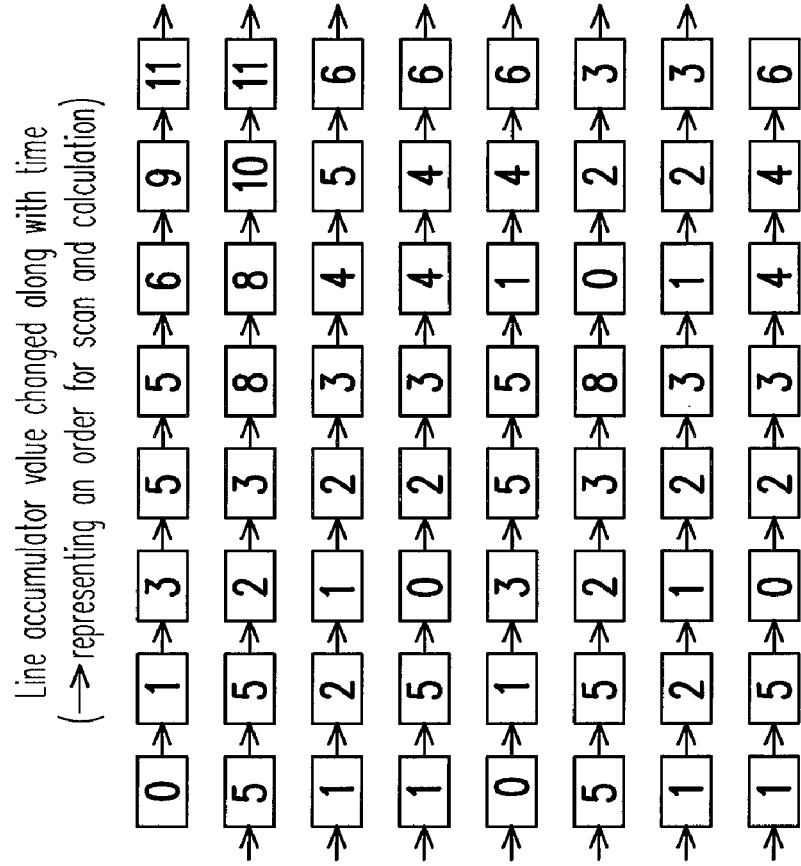
FIG. 16 is a schematic diagram illustrating a value variation of a line accumulator along with time according to an embodiment of the disclosure.
Figure 17:
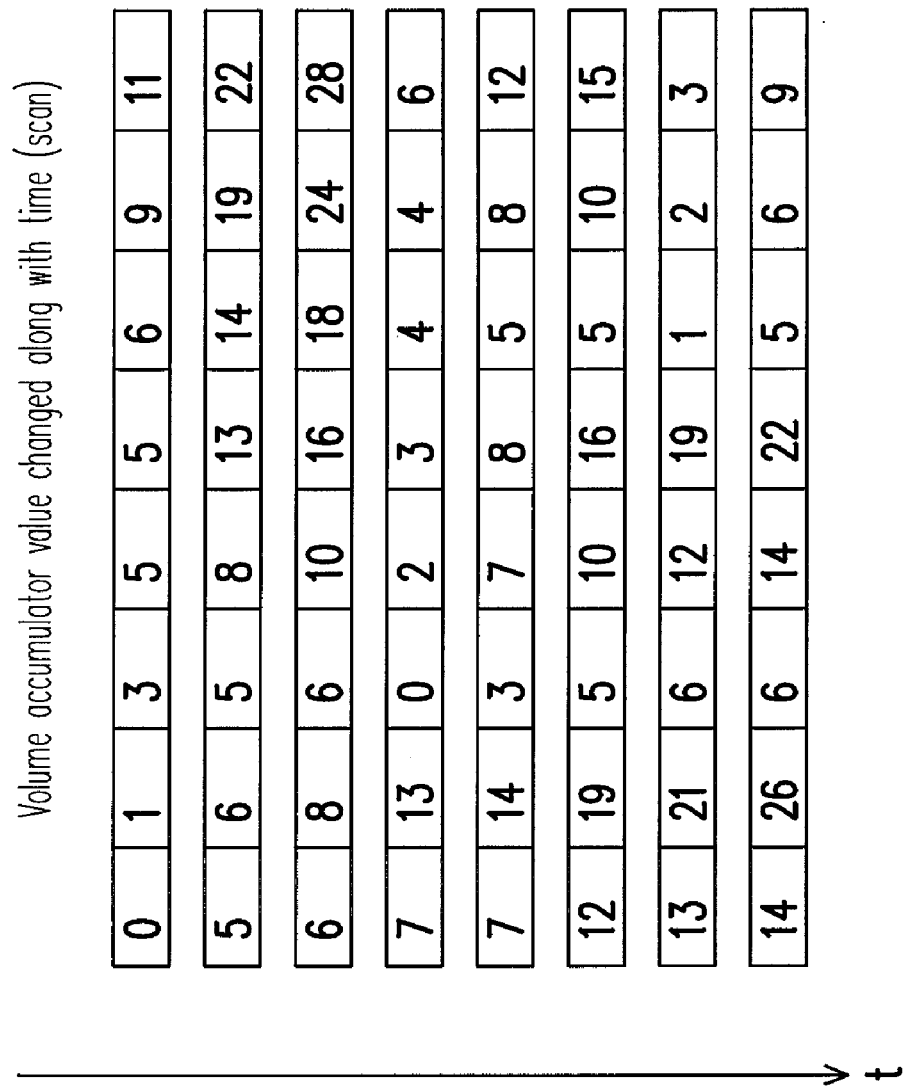
FIG. 17 is a schematic diagram illustrating a value variation of a volume accumulator along with time according to an embodiment of the disclosure.

Regarding the aforesaid integral image calculation process of the image sensor, another embodiment is provided below for description. FIG. 15 is an example of calculating the integral image according to an embodiment of the disclosure, FIG. 16 is a schematic diagram illustrating a value variation of the line accumulator along with time according to an embodiment of the disclosure, and FIG. 17 is a schematic diagram illustrating a value variation of the volume accumulator along with time according to an embodiment of the disclosure. Referring to FIGS. 15, 16 and 17, when the image sensor calculates the integral pixel value of the third pixel in the first scan line of the image 1500, since a next scan line is being switched to, the line accumulator is re-accumulated to obtain the accumulated line pixel value 3, and the sub integral pixel value of the pixel is 3.

When the image sensor calculates the integral pixel value of the second pixel in the fourth scan line of the image 1500, since the vertical and the horizontal boundaries are not crossed, the line accumulator and the volume accumulator continually accumulate. Therefore, the accumulated value of the line accumulator is 1+4=5, and the accumulated line pixel value is accumulated to an old value of this pixel (i.e. the second pixel) in the volume accumulator, i.e. the sub integral pixel value of the corresponding pixel (i.e. the second pixel) in the previous scan line (i.e. the third scan line), so as to obtain the sub integral pixel value 8+5=13 of the target pixel, which is used to replace the sub integral pixel value of the corresponding pixel in the volume accumulator.

When the image sensor calculates the integral pixel value of the third pixel in the fourth scan line of the image 1500, since the vertical and the horizontal boundaries are both crossed, the line accumulator and the volume accumulator are all re-accumulated. Therefore, the accumulated value of the line accumulator is the pixel value (i.e. 0), and the accumulated value of the volume accumulator is the accumulated line pixel value of the pixel (i.e. 0), so that the sub integral pixel value of the target pixel is 0, which is used to replace the sub integral pixel value of the corresponding pixel in the volume accumulator.

Similarly, when the fourth pixel line in the image 1500 is calculated, since the third to the eighth pixels all cross the horizontal boundary, the integral pixel values of the third pixel to the eighth pixel are all re-accumulated by the volume accumulator, i.e. new values are loaded to replace the old accumulated value. To be deduced by analogy, after the pixels in each of the pixel lines of the image 1500 are scanned, the sub integral image of the image 1500 can be obtained.

According to the above embodiment, regardless of how the image being divided into non-even size or non-aligned rectangular regions, the image sensor can calculate the integral image in case that only one line accumulator and one volume accumulator are used.

In summary, in the image sensor having an output of an integral image of the disclosure, a line accumulator and a volume accumulator are applied to immediately calculate the integral image of the captured image when the image sensor captures the image, so as to reduce a consumption of calculation resources of the processor, and accelerate an image processing speed. Moreover, by dividing the image into a plurality of rectangle regions, and using the volume accumulator to respectively calculate the integral image of each of the regions, the integral image can also be quickly obtained. The line accumulator is only required to have a capacity enough for storing a set of accumulated pixel values, and the volume accumulator is only required to have a capacity enough for storing the pixel values of one pixel line, so that a cost of the image sensor is saved, and the image sensor can further provide a new output format of the integral image to the post processor for utilization.

It will be apparent to those skilled in the art that various modifications and variations can be made to the structure of the disclosure without departing from the scope or spirit of the invention. In view of the foregoing, it is intended that the disclosure cover modifications and variations of this invention provided they fall within the scope of the following claims and their equivalents.

What is claimed is:

1. An image sensor having an output of an integral image, comprising:
    a pixel circuit, comprising a plurality of pixels, for capturing pixel values of a plurality of pixels in an image;
    a line accumulator, coupled to the pixel circuit, for accumulating the pixel values of the pixels from a first pixel to a target pixel in a target pixel line of the image, so as to obtain an accumulated line pixel value; and
    a volume accumulator, coupled to the line accumulator, for adding the accumulated line pixel value output by the line accumulator to an integral pixel value of the pixel corresponding to the target pixel in a previous pixel line of the target pixel line, and using an adding result as the integral pixel value of the target pixel, so as to output the integral pixel value of the target pixel;
    a multiplexer, coupled to the pixel circuit and the volume accumulator, for outputting the pixel value or the integral pixel value of each of the pixels in the image; and
    a pre-processing unit, configured between the pixel circuit and the line accumulator, for performing a pre-processing to the pixel values of the pixels output by the pixel circuit.

2. The image sensor having an output of an integral image as claimed in claim 1, wherein the line accumulator comprises:
    a first buffer, for recording the accumulated line pixel value of the pixels in the target pixel line; and
    a first adder, for receiving the pixel value of the target pixel, and accumulating the pixel value to the accumulated line pixel value recorded by the first buffer.

3. The image sensor having an output of an integral image as claimed in claim 1, wherein the volume accumulator comprises:
    a second buffer, for recording the integral pixel value of the pixels in a previous pixel line of the target pixel line; and
    a second adder, for adding the accumulated line pixel value output by the line accumulator to the integral pixel value of the pixel corresponding to the target pixel in a previous pixel line, which is recorded by the second buffer, and using an adding result as the integral pixel value of the target pixel, so as to output the integral pixel value of the target pixel.

4. The image sensor having an output of an integral image as claimed in claim 3, wherein the second adder further writes the accumulated integral pixel value of the target pixel into the second buffer for replacing the integral pixel value of the pixel corresponding to the target pixel in the previous pixel line.

5. The image sensor having an output of an integral image as claimed in claim 1, wherein the pre-processing comprises color balance, de-mosaicking, distortion compensation or correction.

6. The image sensor having an output of an integral image as claimed in claim 1, wherein the line accumulator is reset each time after accumulating pixel values of all of the pixels in a pixel line of the image.

7. The image sensor having an output of an integral image as claimed in claim 1, wherein the volume accumulator sequentially outputs integral pixel values of the pixels in the target pixel line.

8. The image sensor having an output of an integral image as claimed in claim 1, wherein the volume accumulator outputs the integral pixel values of all of the pixels in the target pixel line after obtaining the integral pixel values of all of the pixels in the target pixel line.

9. The image sensor having an output of an integral image as claimed in claim 1, wherein the integral pixel values of the pixels of the image that are output by the volume accumulator forms an integral image.

10. The image sensor having an output of an integral image as claimed in claim 1, wherein the pixel circuit further captures pixel values of a plurality of color spaces of the pixels in the image, respectively.

11. The image sensor having an output of an integral image as claimed in claim 10, wherein the line accumulator further accumulates the pixel values of each of the color spaces of the pixels from the first pixel to the target pixel in the target pixel line of the image, so as to obtain the accumulated line pixel value of each of the color spaces.

12. The image sensor having an output of an integral image as claimed in claim 11, wherein the volume accumulator further accumulates the accumulated line pixel value of each of the color spaces that is output by the line accumulator to an integral pixel value of each of the color spaces of the pixel corresponding to the target pixel in a previous pixel line of the target pixel line, and uses a result thereof as the integral pixel value of each of the color spaces of the target pixel, and outputs the integral pixel value of each of the color spaces of the target pixel.

13. The image sensor having an output of an integral image as claimed in claim 10, wherein the color space comprises one of a RGB color space, a YCrCb color space and a YUV color space.

14. The image sensor having an output of an integral image as claimed in claim 1, wherein the pixel corresponding to the target pixel in a previous pixel line of the target pixel line is a pixel in a same column as that of the target pixel in the previous pixel line.

15. An image sensor having an output of an integral image, comprising:
a pixel circuit, comprising a plurality of pixels, for capturing pixel values of the pixels in an image, wherein the pixel circuit is divided into a plurality of rectangular regions;
a line accumulator, coupled to the pixel circuit, for accumulating the pixel values of the pixels from a first pixel to a target pixel in a target pixel line of each of the rectangular regions of the image, so as to obtain an accumulated line pixel value; and
a volume accumulator, coupled to the line accumulator, for adding the accumulated line pixel value output by the line accumulator to an integral pixel value of the pixel corresponding to the target pixel in a previous pixel line of the target pixel line of each of the rectangular regions, and using an adding result as the integral pixel value of the target pixel, so as to output the integral pixel value of the target pixel;
a multiplexer, coupled to the pixel circuit and said volume accumulator, for outputting the pixel value or the integral pixel value of each of the pixels in the image; and
a pre-processing unit, configured between the pixel circuit and the line accumulator, for performing a pre-processing to the pixel values of the pixels output by the pixel circuit.

16. The image sensor having an output of an integral image as claimed in claim 15, wherein the line accumulator is reset when a vertical boundary of the rectangular regions is crossed or when a next scan pixel line is being switched to.

17. The image sensor having an output of an integral image as claimed in claim 16, wherein the volume accumulator is reset when the horizontal boundary of the rectangular regions is crossed.

18. The image sensor having an output of an integral image as claimed in claim 15, wherein the pixel circuit is equally divided into a top-left region, a top-right region, a bottom-left region and a bottom-right region.

19. The image sensor having an output of an integral image as claimed in claim 18, wherein the line accumulator accumulates the pixel values of the pixels from the first pixel to the target pixel in the target pixel line of the top-left region of the image, so as to obtain the accumulated line pixel value, and the volume accumulator accumulates the accumulated line pixel value to the integral pixel value of the pixel corresponding to the target pixel in a previous pixel line of the target pixel line of the top-left region, and uses a result thereof as a sub integral pixel value of the target pixel of the top-left region.

20. The image sensor having an output of an integral image as claimed in claim 19, wherein the line accumulator accumulates the pixel values of the pixels from the first pixel to the target pixel in the target pixel line of the top-right region of the image, so as to obtain the accumulated line pixel value, and the volume accumulator accumulates the accumulated line pixel value to the integral pixel value of the pixel corresponding to the target pixel in a previous pixel line of the target pixel line of the top-right region, and uses a result thereof as the sub integral pixel value of the target pixel of the top-right region.

21. The image sensor having an output of an integral image as claimed in claim 20, wherein the line accumulator accumulates the pixel values of the pixels from the first pixel to the target pixel in the target pixel line of the bottom-left region of the image, so as to obtain the accumulated line pixel value, and the volume accumulator accumulates the accumulated line pixel value to the integral pixel value of the pixel corresponding to the target pixel in a previous pixel line of the target pixel line of the bottom-left region, and uses a result thereof as the sub integral pixel value of the target pixel of the bottom-left region.

22. The image sensor having an output of an integral image as claimed in claim 21, wherein the line accumulator accumulates the pixel values of the pixels from the first pixel to the target pixel in the target pixel line of the bottom-right region of the image, so as to obtain the accumulated line pixel value, and the volume accumulator accumulates the accumulated line pixel value to the integral pixel value of the pixel corresponding to the target pixel in a previous pixel line of the target pixel line of the bottom-right region, and uses a result thereof as the sub integral pixel value of the target pixel of the bottom-right region.

23. The image sensor having an output of an integral image as claimed in claim 15, wherein the pixel circuit is divided into M×N rectangular regions, and M and N are positive integers.

24. The image sensor having an output of an integral image as claimed in claim 15, wherein the line accumulator comprises:
a first buffer, for recording the accumulated line pixel value of the pixels of each of the rectangular regions in the target pixel line; and
a first adder, for receiving the pixel value of the target pixel of each of the rectangular regions, and accumulating the pixel value to the accumulated line pixel value recorded by the first buffer.

25. The image sensor having an output of an integral image as claimed in claim 24, wherein the line accumulator further comprises:
a first multiplexer, for resetting the first buffer each time when the vertical boundary of the rectangle region is crossed or when a next scan pixel line is being switched to.

26. The image sensor having an output of an integral image as claimed in claim 15, wherein the volume accumulator comprises:
a second buffer, for recording the integral pixel value of the pixels in a previous pixel line of the target pixel line of each of the rectangular regions; and
a second adder, for adding the accumulated line pixel value output by the line accumulator to the integral pixel value of the pixel corresponding to the target pixel in the previous pixel line of each of the rectangular regions, which is recorded by the second buffer, and using an adding result as the integral pixel value of the target pixel, so as to output the integral pixel value of the target pixel.

27. The image sensor having an output of an integral image as claimed in claim 26, wherein the second adder further writes the accumulated integral pixel value of the target pixel into the second buffer for replacing the integral pixel value of the pixel corresponding to the target pixel in the previous pixel line.

28. The image sensor having an output of an integral image as claimed in claim 26, wherein the second adder further comprises:
a second multiplexer, for resetting the second buffer when the horizontal boundary of the rectangular region is crossed.

29. The image sensor having an output of an integral image as claimed in claim 15, further comprising:
a third multiplexer, coupled to the pixel circuit and the volume accumulator, for outputting the pixel value or the integral pixel value of the pixels in each of the rectangular regions of the image.

30. The image sensor having an output of an integral image as claimed in claim 15, further comprising:
a pre-processing unit, configured between the pixel circuit and the line accumulator, for performing a pre-processing to the pixel values of the pixels output by the pixel circuit.

31. The image sensor having an output of an integral image as claimed in claim 30, wherein the pre-processing comprises color balance, de-mosaicking, distortion compensation or correction.

32. The image sensor having an output of an integral image as claimed in claim 15, wherein the volume accumulator sequentially outputs integral pixel values of the pixels in the target pixel line of each of the rectangular regions.

33. The image sensor having an output of an integral image as claimed in claim 15, wherein the volume accumulator outputs the integral pixel values of all of the pixels in the target pixel line after obtaining the integral pixel values of all of the pixels in the target pixel line of each of the rectangular regions.

34. The image sensor having an output of an integral image as claimed in claim 15, wherein the integral pixel values of the pixels of each of the rectangular regions of the image that are output by the volume accumulator forms an integral image.

35. An image sensor having an output of an integral image, comprising: a pixel circuit, comprising a plurality of pixels, for capturing pixel values of the pixels in an image; wherein the pixel circuit is divided into M×N rectangular regions, and M and N are positive integers;
a line accumulator, coupled to the pixel circuit, for accumulating the pixel values of the pixels from a first pixel to a target pixel in a target pixel line of each of the rectangular regions of the image, so as to obtain an accumulated line pixel value; and
N volume accumulators, coupled to the line accumulator, for adding the accumulated line pixel value output by the line accumulator to an integral pixel value of the pixel corresponding to the target pixel in a previous pixel line of the target pixel line of each of the rectangular regions, and using an adding result as the integral pixel value of the target pixel, so as to output the integral pixel value of the target pixel;
a multiplexer, coupled to the pixel circuit and the volume accumulator, for outputting the pixel value or the integral pixel value of each of the pixels in the image; and
a pre-processing unit, configured between the pixel circuit and the line accumulator, for performing a pre-processing to the pixel values of the pixels output by the pixel circuit.

36. The image sensor having an output of an integral image as claimed in claim 35, wherein the pixel circuit is equally divided into a top-left region, a top-right region, a bottom-left region and a bottom-right region.

37. The image sensor having an output of an integral image as claimed in claim 36, wherein the line accumulator accumulates the pixel values of the pixels from the first pixel to the target pixel in the target pixel line of the top-left region of the image, so as to obtain the accumulated line pixel value, and a first volume accumulator of the volume accumulators accumulates the accumulated line pixel value to the integral pixel value of the pixel corresponding to the target pixel in a previous pixel line of the target pixel line of the top-left region, and uses a result thereof as a sub integral pixel value of the target pixel of the top-left region.

38. The image sensor having an output of an integral image as claimed in claim 37, wherein the line accumulator accumulates the pixel values of the pixels from the first pixel to the target pixel in the target pixel line of the top-right region of the image, so as to obtain the accumulated line pixel value, and the first volume accumulator of the volume accumulators accumulates the accumulated line pixel value to the integral pixel value of the pixel corresponding to the target pixel in a previous pixel line of the target pixel line of the top-right region, and uses a result thereof as the sub integral pixel value of the target pixel of the top-right region.

39. The image sensor having an output of an integral image as claimed in claim 38, wherein the line accumulator accumulates the pixel values of the pixels from the first pixel to the target pixel in the target pixel line of the bottom-left region of the image, so as to obtain the accumulated line pixel value, and a second volume accumulator of the volume accumulators accumulates the accumulated line pixel value to the integral pixel value of the pixel corresponding to the target pixel in a previous pixel line of the target pixel line of the bottom-left region, and uses a result thereof as the sub integral pixel value of the target pixel of the bottom-left region.

40. The image sensor having an output of an integral image as claimed in claim 39, wherein the line accumulator accumulates the pixel values of the pixels from the first pixel to the target pixel in the target pixel line of the bottom-right region of the image, so as to obtain the accumulated line pixel value, and the second volume accumulator of the volume accumulators accumulates the accumulated line pixel value to the integral pixel value of the pixel corresponding to the target pixel in a previous pixel line of the target pixel line of the bottom-right region, and uses a result thereof as the sub integral pixel value of the target pixel of the bottom-right region.

41. The image sensor having an output of an integral image as claimed in claim 35, wherein the pixel circuit is equally divided into M×N rectangular regions.

42. The image sensor having an output of an integral image as claimed in claim 35, wherein the line accumulator comprises:
- a first buffer, for recording the accumulated line pixel value of the pixels in the target pixel line of each of the rectangular regions; and
- a first adder, for receiving the pixel value of the target pixel of each of the rectangular regions, and accumulating the pixel value to the accumulated line pixel value recorded by the first buffer.

43. The image sensor having an output of an integral image as claimed in claim 35, wherein each of the volume accumulators comprises:
- a second buffer, for recording the integral pixel value of the pixels in a previous pixel line of the target pixel line of each of the rectangular regions; and
- a second adder, for adding the accumulated line pixel value output by the line accumulator to the integral pixel value of the pixel corresponding to the target pixel in the previous pixel line of each of the rectangular regions, which is recorded by the second buffer, and using an adding result as the integral pixel value of the target pixel, so as to output the integral pixel value of the target pixel.

44. The image sensor having an output of an integral image as claimed in claim 43, wherein the second adder further writes the accumulated integral pixel value of the target pixel into the second buffer for replacing the integral pixel value of the pixel corresponding to the target pixel in the previous pixel line.

45. The image sensor having an output of an integral image as claimed in claim 35, further comprising:
- a multiplexer, coupled to the pixel circuit and the volume accumulators, for outputting the pixel value or the integral pixel value of the pixels in each of the rectangular regions of the image.

46. The image sensor having an output of an integral image as claimed in claim 35, further comprising:
- a pre-processing unit, configured between the pixel circuit and the line accumulator, for performing a pre-processing to the pixel values of the pixels output by the pixel circuit.

47. The image sensor having an output of an integral image as claimed in claim 46, wherein the pre-processing comprises color balance, de-mosaicking, distortion compensation or correction.

48. The image sensor having an output of an integral image as claimed in claim 35, wherein the line accumulator is reset each time after accumulating pixel values of all of pixels in a pixel line of each of the rectangular regions of the image.

49. The image sensor having an output of an integral image as claimed in claim 35, wherein each of the volume accumulators sequentially outputs integral pixel values of the pixels in the target pixel line of each of the rectangular regions.

50. The image sensor having an output of an integral image as claimed in claim 35, wherein the volume accumulator outputs the integral pixel values of all of the pixels in the target pixel line after obtaining the integral pixel values of all of the pixels in the target pixel line of each of the rectangular regions.

51. The image sensor having an output of an integral image as claimed in claim 35, wherein the integral pixel values of the pixels of each of the rectangular regions of the image that are output by the volume accumulators forms an integral image.

* * * * *